US009006084B2

(12) United States Patent
Sakai

(10) Patent No.: US 9,006,084 B2
(45) Date of Patent: Apr. 14, 2015

(54) METHOD OF PREPARING SEMICONDUCTOR LAYER INCLUDING CAVITIES

(75) Inventor: Shiro Sakai, Tokushima (JP)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 13/507,210

(22) Filed: Jun. 13, 2012

(65) Prior Publication Data
US 2012/0258559 A1 Oct. 11, 2012

Related U.S. Application Data

(63) Continuation of application No. 12/929,712, filed on Feb. 10, 2011, now Pat. No. 8,481,411, which is a continuation-in-part of application No. 12/801,455, filed on Jun. 9, 2010, now Pat. No. 8,860,183.

(30) Foreign Application Priority Data

Jun. 10, 2009 (JP) .................................. 2009-139212
Jul. 15, 2009 (JP) .................................. 2009-166682
Aug. 25, 2009 (JP) .................................. 2009-194334
Feb. 10, 2010 (JP) .................................. 2010-027650
Nov. 25, 2010 (JP) .................................. 2010-263008

(51) Int. Cl.
*H01L 21/46* (2006.01)
*H01L 21/02* (2006.01)
(Continued)

(52) U.S. Cl.
CPC ............ *H01L 21/0254* (2013.01); *C30B 25/02* (2013.01); *C30B 29/406* (2013.01); *H01L 29/2003* (2013.01); *H01L 33/0075* (2013.01)

(58) Field of Classification Search
CPC ............ H01L 21/0254; H01L 29/2003; H01L 33/0075
USPC .................................... 438/458; 257/E33.025
See application file for complete search history.

(56) References Cited

U.S. PATENT DOCUMENTS 6,024,884 A    2/2000  Bryant et al.
6,294,475 B1 * 9/2001  Schubert et al. .............. 438/712
(Continued)

FOREIGN PATENT DOCUMENTS

CN       1378237      11/2002
CN       10034116     10/2007
(Continued)

OTHER PUBLICATIONS

Notice of Allowance issued for related U.S. Appl. No. 12/650,276 dated Jun. 25, 2012.
(Continued)

*Primary Examiner* — Kevin Parendo
(74) *Attorney, Agent, or Firm* — H.C. Park & Associates, PLC

(57) ABSTRACT

A method of fabricating a semiconductor substrate, includes forming a first semiconductor layer on a substrate, forming a metallic material layer on the first semiconductor layer, forming a second semiconductor layer on the first semiconductor layer and the metallic material layer, etching the substrate using a solution to remove the metallic material layer and a portion of the first semiconductor layer, and forming a cavity in the first semiconductor layer under where the metallic material layer was removed.

10 Claims, 34 Drawing Sheets
(12 of 34 Drawing Sheet(s) Filed in Color)

(51) Int. Cl.
*C30B 25/02* (2006.01)
*C30B 29/40* (2006.01)
*H01L 29/20* (2006.01)
*H01L 33/00* (2010.01)

(56) References Cited

U.S. PATENT DOCUMENTS

| | | | |
|---|---|---|---|
| 7,101,444 B2 | 9/2006 | Shchukin et al. | |
| 7,196,399 B2 | 3/2007 | Usui et al. | |
| 7,230,282 B2 | 6/2007 | Shibata | |
| 7,364,991 B2 | 4/2008 | Bour et al. | |
| 7,435,608 B2 | 10/2008 | Shibata | |
| 7,642,112 B2 | 1/2010 | Atoji et al. | |
| 7,829,913 B2 | 11/2010 | Shibata et al. | |
| 8,026,119 B2 | 9/2011 | Kim et al. | |
| 8,053,811 B2 | 11/2011 | Hiramatsu et al. | |
| 8,198,179 B2 | 6/2012 | Sakai et al. | |
| 2001/0053618 A1 | 12/2001 | Kozaki et al. | |
| 2002/0197825 A1* | 12/2002 | Usui et al. | 438/459 |
| 2003/0047746 A1 | 3/2003 | Kuniyasu et al. | |
| 2003/0143771 A1 | 7/2003 | Kidoguchi et al. | |
| 2003/0183157 A1 | 10/2003 | Usui et al. | |
| 2004/0021147 A1 | 2/2004 | Ishibashi et al. | |
| 2004/0206967 A1* | 10/2004 | Oshima et al. | 257/85 |
| 2004/0209442 A1 | 10/2004 | Takakuwa et al. | |
| 2005/0077512 A1 | 4/2005 | Yoon et al. | |
| 2005/0194564 A1 | 9/2005 | Fujita et al. | |
| 2006/0006408 A1 | 1/2006 | Suehiro et al. | |
| 2006/0073644 A1* | 4/2006 | Atoji et al. | 438/147 |
| 2006/0151797 A1 | 7/2006 | Park | |
| 2006/0151801 A1 | 7/2006 | Doan et al. | |
| 2007/0243702 A1 | 10/2007 | Nijhawan et al. | |
| 2008/0014723 A1 | 1/2008 | Shibata | |
| 2008/0251803 A1 | 10/2008 | Cho et al. | |
| 2008/0296586 A1* | 12/2008 | Francis et al. | 257/77 |
| 2009/0085165 A1* | 4/2009 | Hiramatsu et al. | 257/615 |
| 2009/0093122 A1 | 4/2009 | Ueda et al. | |
| 2009/0098677 A1 | 4/2009 | Shibata | |
| 2009/0117711 A1* | 5/2009 | Harle et al. | 438/463 |
| 2009/0130853 A1* | 5/2009 | Chou et al. | 438/702 |
| 2009/0280625 A1* | 11/2009 | Lin et al. | 438/478 |
| 2009/0290610 A1 | 11/2009 | Eichler et al. | |
| 2010/0015739 A1 | 1/2010 | Park | |
| 2010/0139758 A1 | 6/2010 | Chang et al. | |
| 2010/0155740 A1* | 6/2010 | Chinone et al. | 257/76 |
| 2010/0219436 A1 | 9/2010 | Watanabe | |
| 2010/0252859 A1 | 10/2010 | Son | |
| 2010/0314661 A1 | 12/2010 | Sakai | |
| 2010/0320506 A1 | 12/2010 | Varangis et al. | |
| 2011/0053303 A1 | 3/2011 | Kim et al. | |

FOREIGN PATENT DOCUMENTS

| | | |
|---|---|---|
| CN | 101180710 | 5/2008 |
| CN | 101253660 | 8/2008 |
| CN | 101477943 | 7/2009 |
| JP | 2003055097 | 2/2003 |
| JP | 20040266624 | 1/2004 |
| JP | 2005057220 | 3/2005 |
| JP | 2005064247 | 3/2005 |
| JP | 2005085851 | 3/2005 |
| KR | 1020020010583 | 2/2002 |
| KR | 1020030030019 | 4/2003 |
| KR | 1020030032965 | 4/2003 |
| KR | 1020050035565 | 4/2005 |
| KR | 1020060081107 | 7/2006 |
| KR | 1020060135568 | 12/2006 |
| KR | 1020070005984 | 1/2007 |
| KR | 1020070009854 | 1/2007 |
| KR | 1020070101424 | 10/2007 |
| KR | 1020080093222 | 10/2008 |
| KR | 1020080100466 | 11/2008 |
| WO | 03098710 | 11/2003 | |
| WO | WO 2006/123540 A1 * | 11/2006 | H01L 21/205 |
| WO | WO 2007/025497 A1 * | 3/2007 | H01L 33/00 |
| WO | 2011/099772 | 8/2011 | |

OTHER PUBLICATIONS

Final Office Action of U.S. Appl. No. 12/650,276 dated Apr. 12, 2012.
Final Office Action of U.S. Appl. No. 12/929,712 dated Apr. 5, 2012.
Notice of Allowance of U.S. Appl. No. 13/137,124 issued Feb. 6, 2012.
Non-Final Office Action of U.S. Appl. No. 13/137,124 issued Nov. 25, 2011.
Non-Final Office Action of U.S. Appl. No. 12/650,276 issued Nov. 10, 2011.
Non-Final Office Action of U.S. Appl. No. 12/929,712 issued Dec. 2, 2011.
International Search Report issued on Sep. 28, 2011, corresponding to International Application No. PCT/KR2011/000871.
Notice of Allowance dated May 27, 2011, issued for related co-pending U.S. Appl. No. 12/805,958.
Notice of Allowance of U.S. Appl. No. 12/805,958 issued on Feb. 25, 2011.
PCT Search Report of PCT/KR2010/004816 dated Feb. 24, 2011, corresponding to U.S. Appl. No. 12/509,958.
International Search Report of PCT/KR2010/003724 issued on Jan. 14, 2011, corresponding to U.S. Appl. No. 12/801,455.
Written Opinion of PCT/KR2010/003724 issued on Jan. 14, 2011, corresponding to U.S. Appl. No. 12/801,455.
Haino et al., "Buried Tungsten Metal Structure Fabricated by Epitaxial-Lateral-Overgrown GaN via Low-Pressure Metalorganic Vapor Phase Epitaxy," Japan Journal of Applied Physics, vol. 39, 2000, pp. 449-452.
Hasegawa et al., "Polycrystalline GaN for light emitter and field electron emitter applications," Thin Solid Films 487 (2005), pp. 260-267.
Notice of Allowance of U.S. Appl. No. 13/506,295 issued on Jul. 25, 2012.
Non-Final Office Action of U.S. Appl. No. 12/801,455 issued Aug. 29, 2012.
Non-Final Office Action of U.S. Appl. No. 12/875,649 dated Oct. 4, 2012.
Final Office Action of U.S. Appl. No. 12/801,455 dated Nov. 23, 2012.
Non-Final Office Action of U.S. Appl. No. 12/929,712 dated Nov. 28, 2012.
Notice of Allowance dated Mar. 5, 2013 issued to related U.S. Appl. No. 12/929,712.
Non-Final Office Action issued to U.S. Appl. No. 13/694,058 dated May 22, 2013.
Notice of Allowance issued on Sep. 4, 2013 in U.S. Appl. No. 13/694,058.
Notice of Allowance issued on Jul. 29, 2013 in U.S. Appl. No. 12/875,649.
Extended European Search Report issued on Feb. 7, 2014 in European Patent Application No. 13 19 6846.
Wolf S., et al., "Chapter 5: Contamination control and cleaning technology for ULSI", Silicon Processing for the VLSI Era, vol. 1., pp. 119-148, CA, US.
Walker, et al., "Handbook of Metal Etchants", CRC Press LLC, 1991, pp. 1252-1261.
Extended European Search Report issued on Feb. 5, 2014 in European Patent Application No. 10 78 6378.
Notice of Allowance issued on Jun. 13, 2014 in U.S. Appl. No. 12/801,455.
Chinese Office Action issued Oct. 10, 2014 in CN Application No. 201180009076.5.
Translation of Office Action Issued on Jan. 15, 2015, in Chinese Patent Application 201310063858.8.

* cited by examiner

Figure 4
(A) SEM micrograph of enlarged region
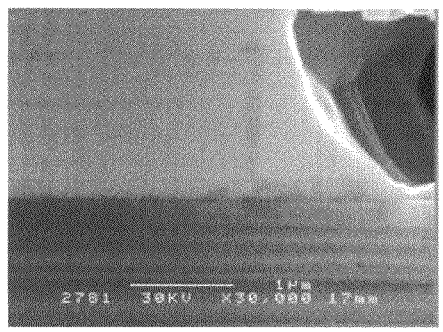
(B) EDX diagram of Ga
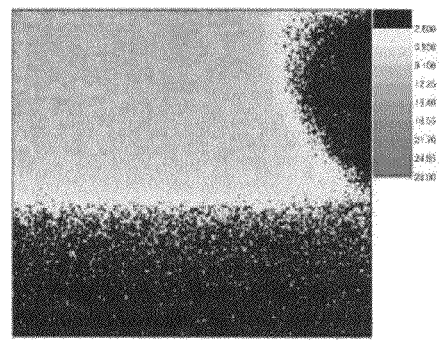
(C) EDX diagram of Al
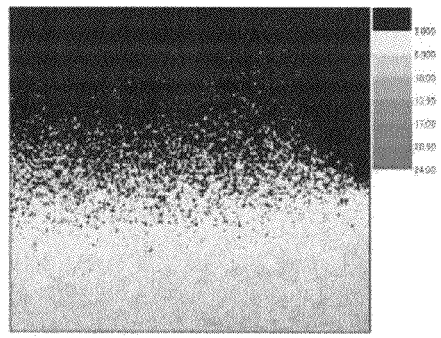
(D) EDX diagram of O
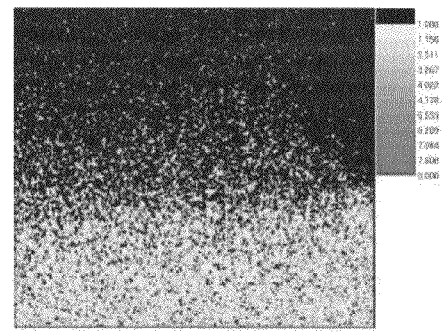

Figure 5
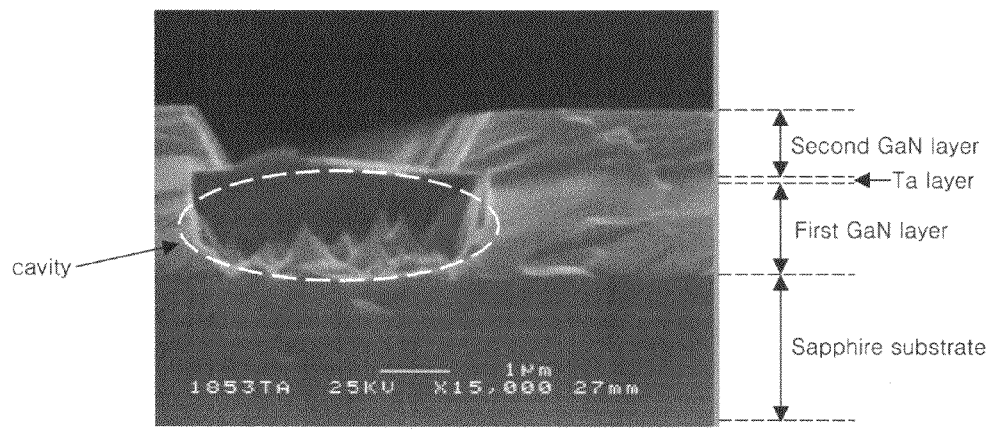
(A) SEM micrograph of side section of substrate
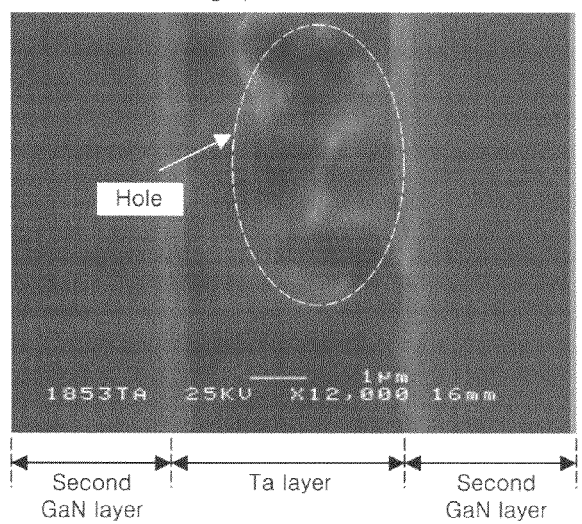
(B) SEM micrograph of surface of substrate Figure 6
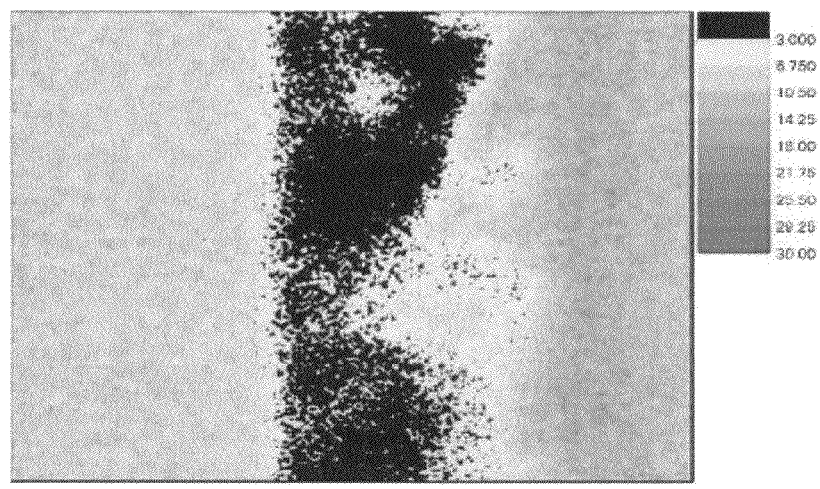
(A) EDX diagram of Ga
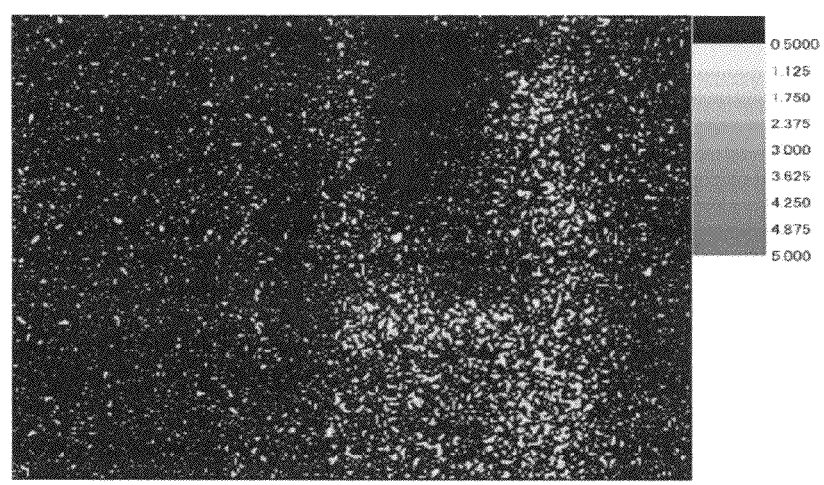
(B) EDX diagram of Ta Figure 7
(A) SEM micrograph of substrate
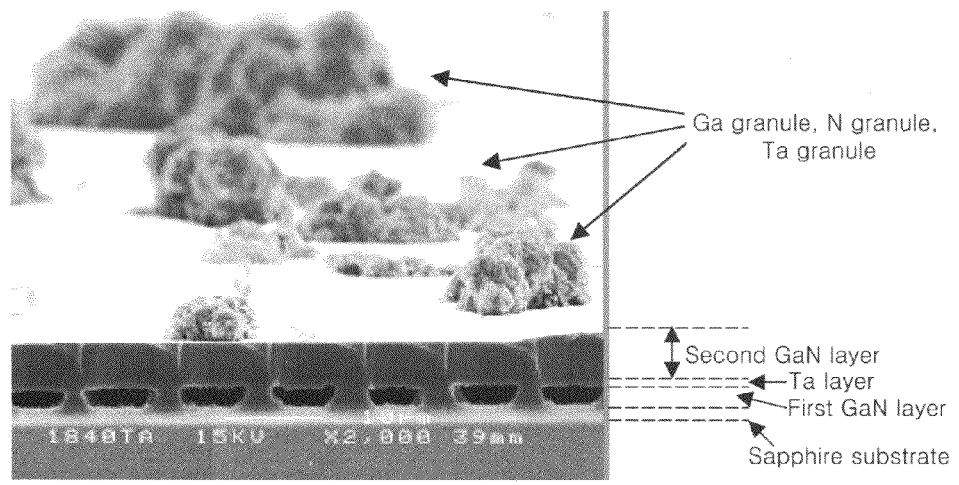
Ga granule, N granule, Ta granule
Second GaN layer
Ta layer
First GaN layer
Sapphire substrate
(B) SEM micrograph of surface of substrate
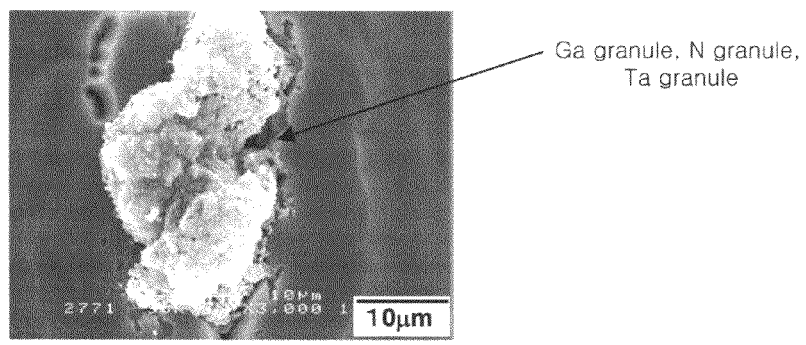
Ga granule, N granule, Ta granule Figure 8
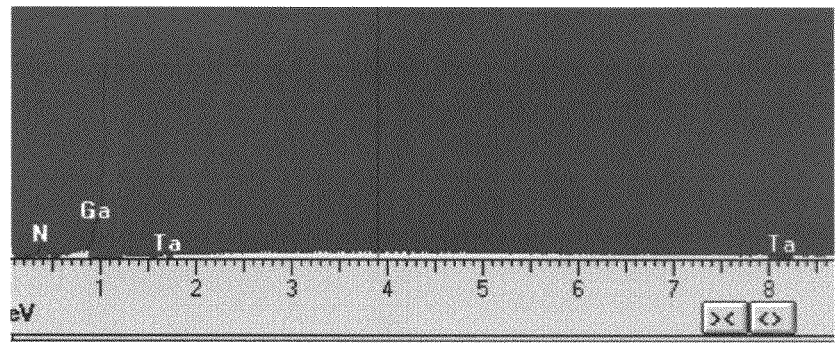
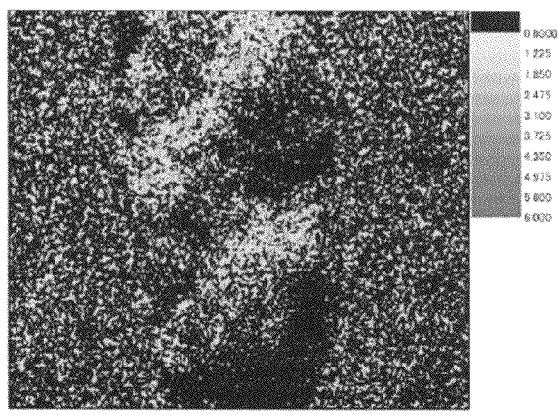

Figure 9
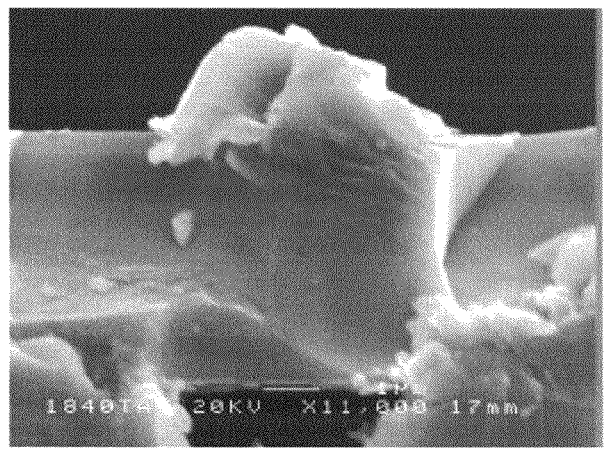
(A) SEM micrograph of void
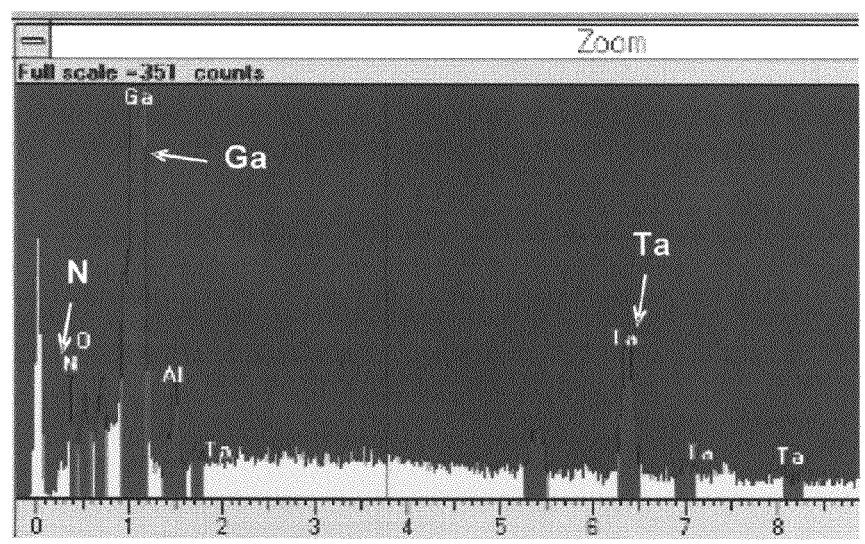
(B) EDX spectrum

Figure 10
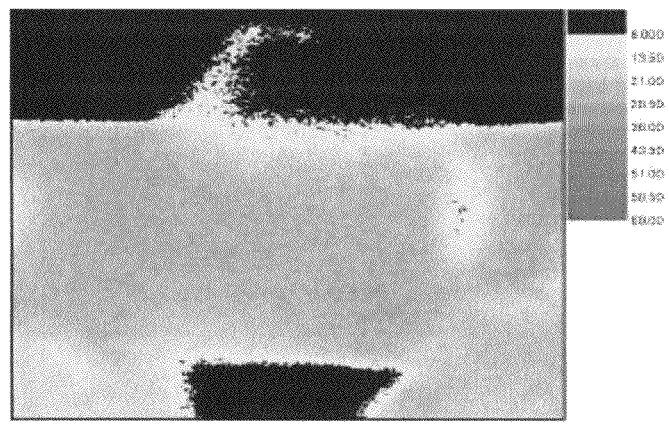
(A) EDX diagram of Ga
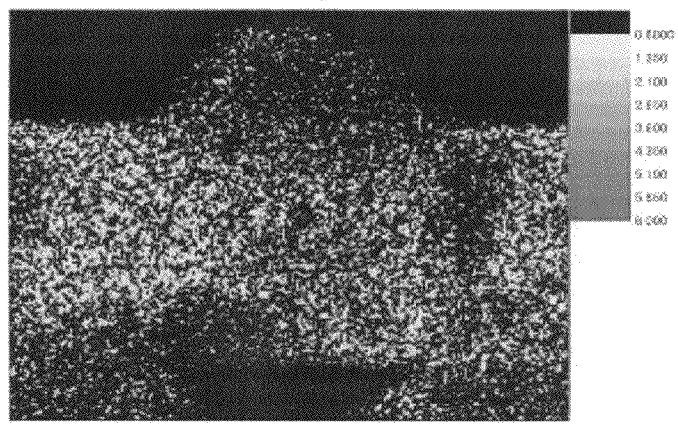
(B) EDX diagram of N
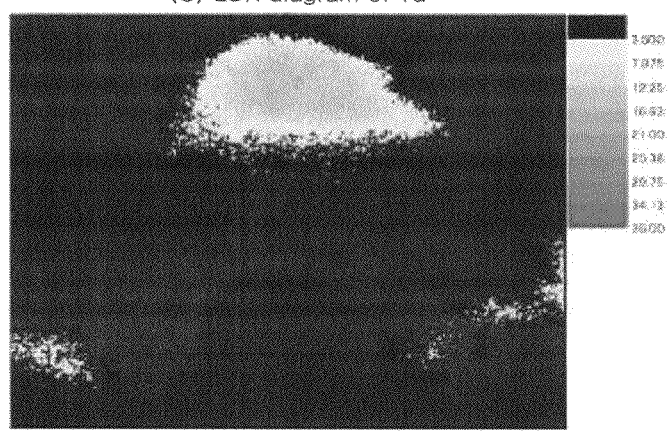
(C) EDX diagram of Ta SEM micrograph of side section of substrate having Ta = 30 nm SEM micrograph of side section of substrate having Ta = 50 nm SEM micrograph of side section of substrate having Ta = 100 nm Figure 15
(A) Example of GaN layer having 5 nm thick Ta layer thereon
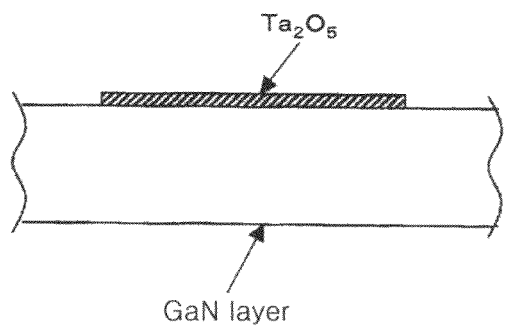
(B) Example of GaN layer having 100 nm thick Ta layer thereon
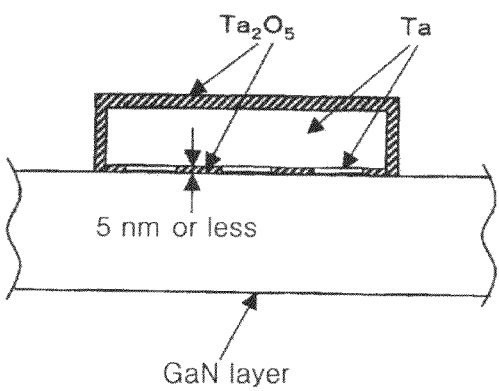

Figure 16
(A) SEM micrograph of side section of substrate having 5 nm thick Ta mask
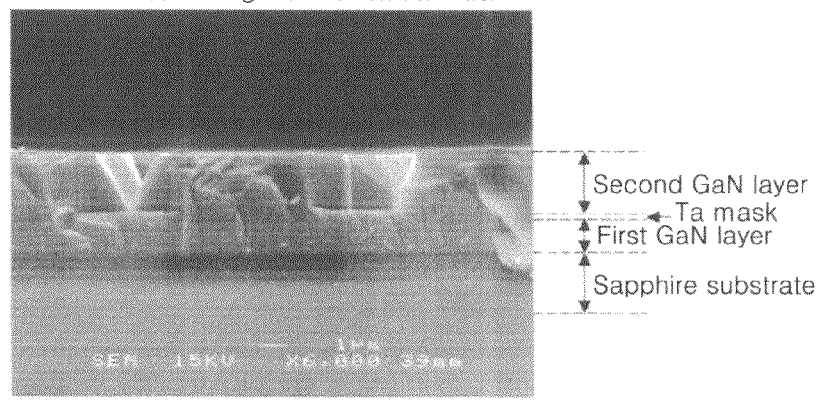
(B) SEM micrograph of side section of substrate having 10 nm thick Ta2O5 mask
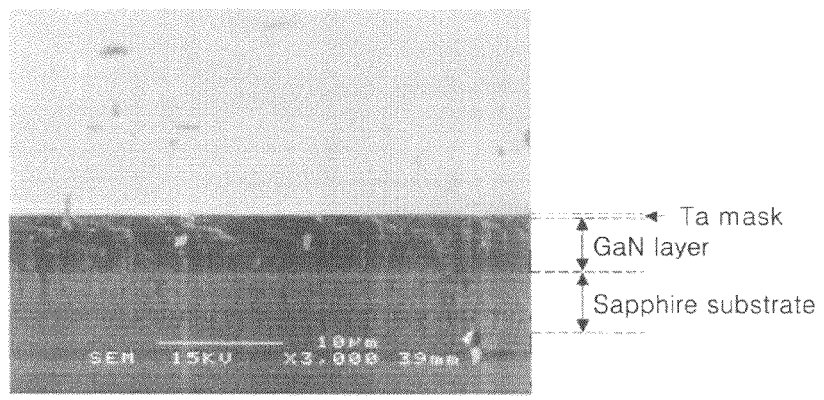

Figure 18
(A) SEM micrograph of side section of substrate formed at 1045°C, Ti = 50 nm
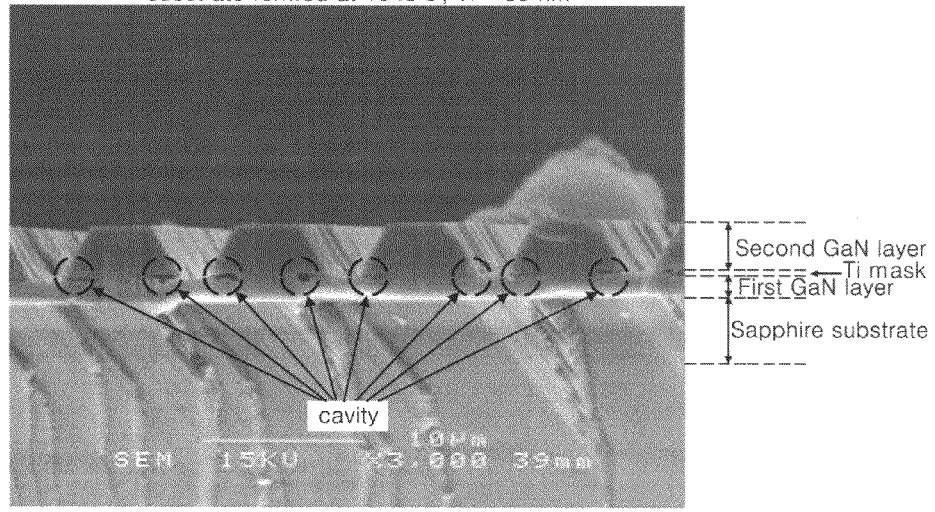
(B) Optical micrograph of side section of substrate formed at 1120°C, Ti = 10 nm
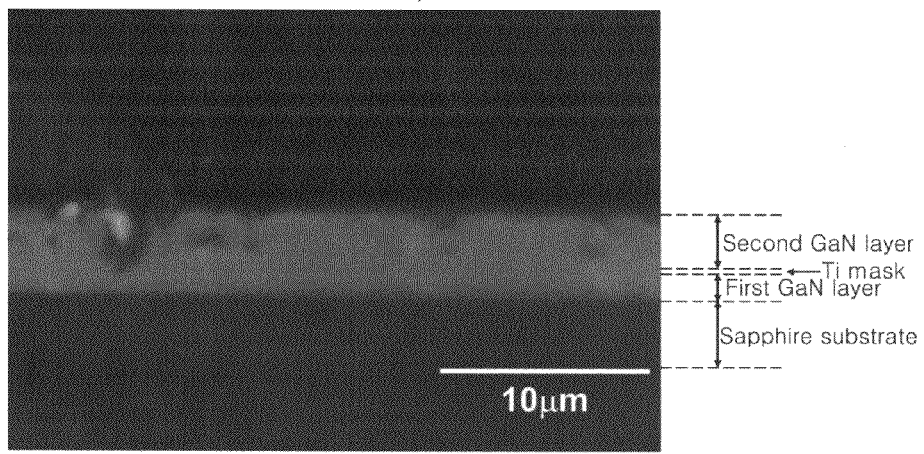

Figure 19
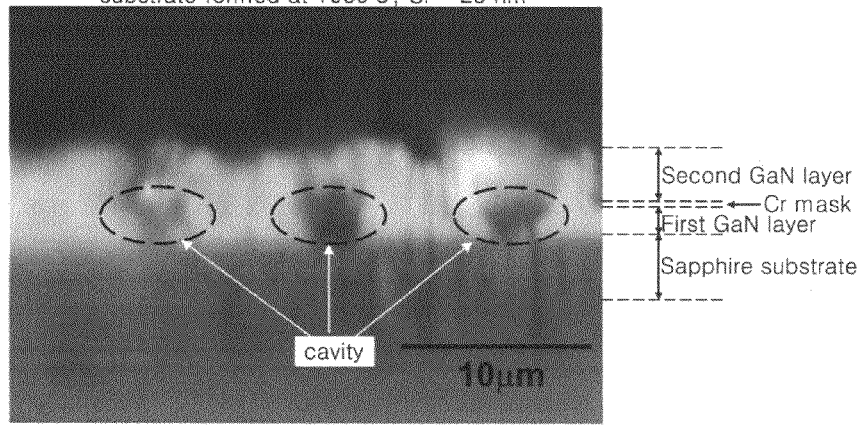
(A) SEM micrograph of side section of substrate formed at 1060°C, Cr = 23 nm
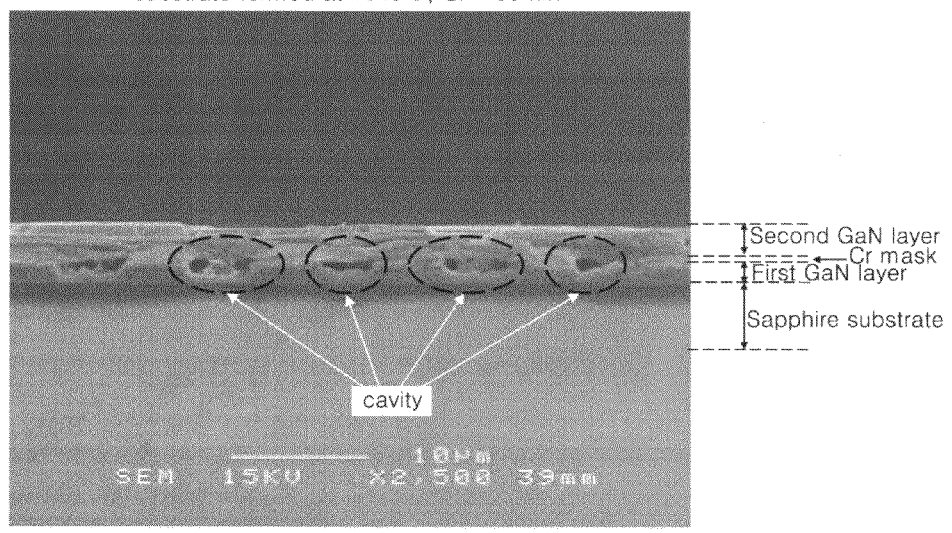
(B) SEM micrograph of side section of substrate formed at 1045°C, Cr = 50 nm Optical micrograph of side section of
substrate formed at 1120°C, Pt = 8 nm SEM micrograph of side section of
substrate formed at 1045°C, Ni = 12 nm Figure 26
(A) SEM micrograph of substrate surface having Ta layer after annealing in NH$_3$
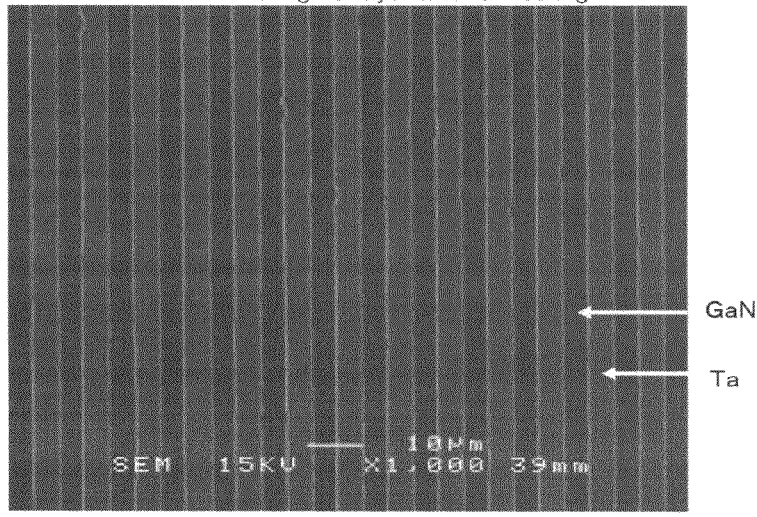
(B) SEM micrograph of side section of substrate of (A)
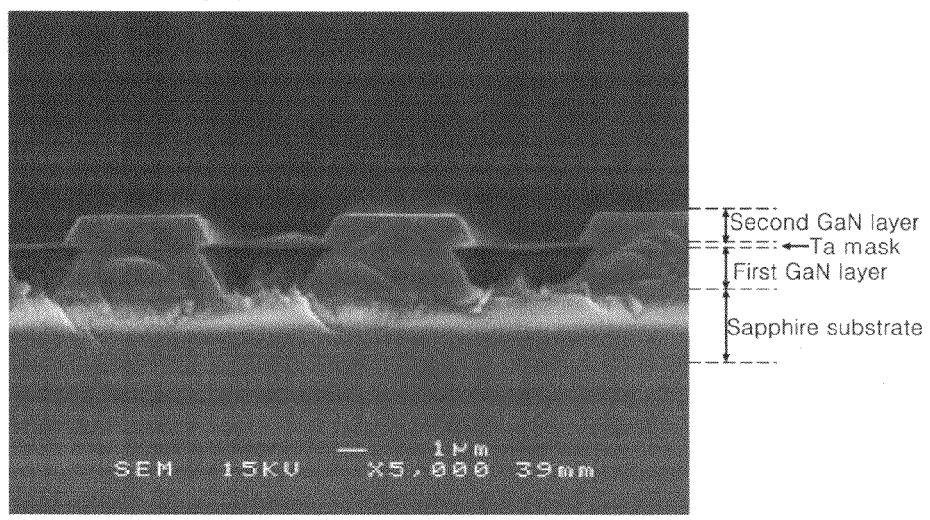

Figure 27
(A) Optical micrograph of GaN layer on sapphire substrate, from which Ta layer is removed
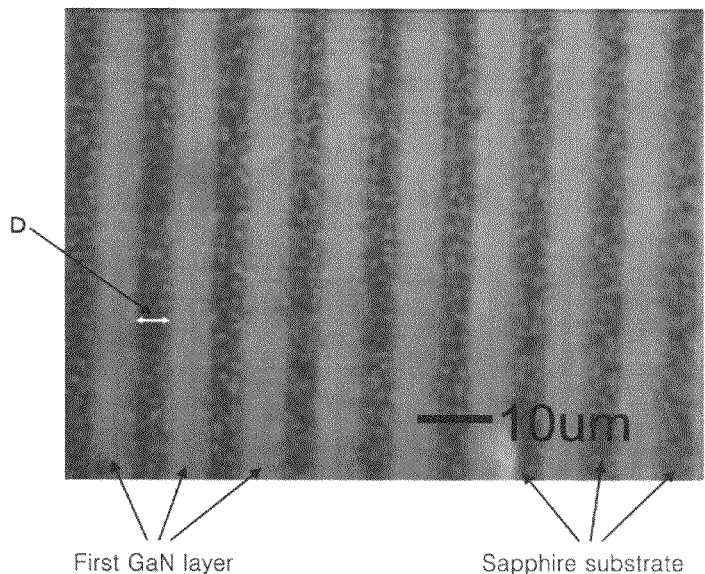
First GaN layer   Sapphire substrate
(B) SEM micrograph of side section of substrate of (A) having GaN layer formed thereon
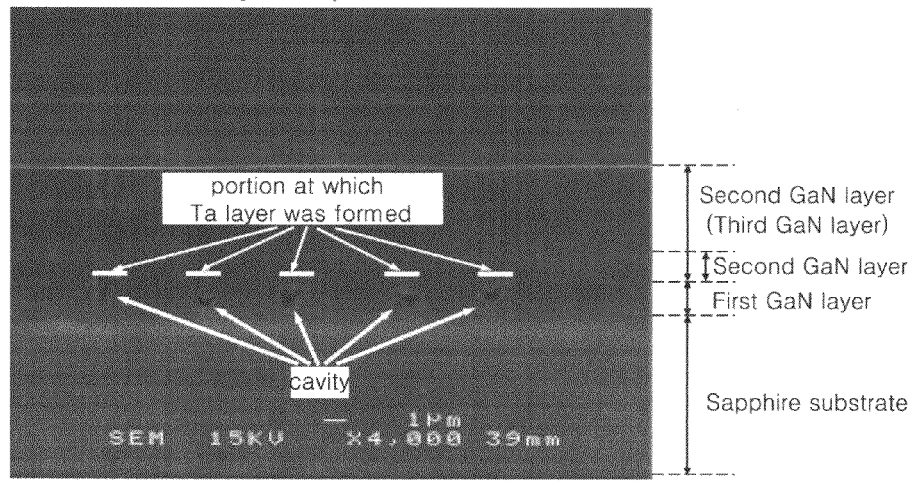

(A) before treatment — Ta particles — 100μm (B) after treatment — 10μm

METHOD OF PREPARING SEMICONDUCTOR LAYER INCLUDING CAVITIES

CROSS-REFERENCE TO RELATED APPLICATIONS

This application is a continuation of U.S. application Ser. No. 12/929,712, filed on Feb. 10, 2011 which is a continuation-in-part of U.S. application Ser. No. 12/801,455, filed on Jun. 9, 2010, and claims priority from and the benefit of Japanese Patent Application No. 2009-139212, filed on Jun. 10, 2009, Japanese Patent Application No. 2009-166682, filed on Jul. 15, 2009, Japanese Patent Application No. 2009-194334, filed on Aug. 25, 2009, Japanese Patent Application No. 2010-263008, filed on Nov. 25, 2010, and Japanese Patent Application No. 2010-027650, filed on Feb. 10, 2010, which are hereby incorporated by reference for all purposes as if fully set forth herein.

BACKGROUND OF THE INVENTION

1. Field of the Invention

Exemplary embodiments of the present invention relate to semiconductor substrates, semiconductor devices, and manufacturing methods thereof. More particularly, exemplary embodiments of the present invention relate to a semiconductor substrate having a GaN layer formed on a substrate, a semiconductor device, and manufacturing methods thereof.

2. Discussion of the Background

A light emitting diode (LED) including a gallium nitride (GaN) based semiconductor may be used for various applications, such as signal devices, backlight units for liquid crystal panels, and the like. It is known that light emitting efficiency of the LED may be affected by dislocation density and crystal defects. Although GaN-based semiconductor crystals may be grown on a heterogeneous substrate, such as sapphire or the like, lattice mismatch and differences in thermal expansion between the GaN layer and the substrate may occur, causing a high dislocation density or an increase in defect density.

Thus, the GaN-based semiconductor crystals may be grown on a homogeneous substrate, such as a GaN substrate and the like. However, a high dissociation rate of nitrogen in GaN may obstruct formation of a GaN melt, thereby making it difficult to form a GaN substrate. Although mechanical polishing, laser delamination or the like may be used to separate the GaN substrate from a GaN bulk crystal grown for the GaN substrate, it may be difficult to produce a GaN substrate having a practical size. Particularly, laser delamination may require a significantly long period of time to perform and may cause an increase in the cost of the GaN substrate.

GaN crystal growth is described in "Polycrystalline GaN for light emitter and field electron emitter applications," by S. Hasegawa, S, Nishida, T. Yamashita, H. Asahi, (Thin Solid Films 487 (2005), pp 260-267), and "Buried Tungsten Metal Structure Fabricated by Epitaxial-Lateral-Overgrown GaN via Low-Pressure Metalorganic Vapor Phase Epitaxy," by M. Haino, et. al., (Jpn. J. Appl. Phys., 39 (2000) L449), which are hereby incorporated by reference in their entirety for all purposes as if fully set forth herein. For example, GaN crystals are respectively grown on quartz substrates, high-melting-point metal substrates of tungsten (W), molybdenum (Mo), tantalum (Ta), and niobium (Nb), and silicon (Si) substrates using plasma-assisted molecular beam epitaxy.

Since fabrication of GaN substrates may be difficult and costly, semiconductor devices such as LEDs or laser diodes are generally manufactured by growing a GaN layer on a heterogeneous substrate such as sapphire and the like. However, as mentioned above, the high dislocation density or increased defect density may degrade the light emitting efficiency of the LED. In addition, sapphire substrates have lower thermal conductivity than GaN substrates, which may deteriorate the heat dissipation properties of a device. Thus, the use of a sapphire substrate for LEDs or laser diodes may limit the operational lifespan thereof.

SUMMARY OF THE INVENTION

Exemplary embodiments of the present invention provide a method of fabricating a flat and easily separable GaN substrate on a heterogeneous substrate at low cost.

Exemplary embodiments of the present invention also provide semiconductor to devices such as LEDs or laser diodes manufactured using the GaN substrate which may have improved performance or long operational lifespan.

Additional features of the invention will be set forth in the description which follows, and in part will be apparent from the description, or may be learned by practice of the invention.

An exemplary embodiment of the present invention provides a method of fabricating a semiconductor substrate including forming a first semiconductor layer on a substrate, forming a metallic material layer on the first semiconductor layer, forming a second semiconductor layer on the first semiconductor layer and the metallic material layer, etching the substrate using a solution to remove the metallic material layer and a portion of the first semiconductor layer, forming a third semiconductor layer on the second semiconductor layer, and forming a cavity in the first semiconductor layer under where the metallic layer was removed.

Another exemplary embodiment of the present invention provides a method of fabricating a semiconductor substrate including forming a first semiconductor layer on a substrate, forming a metallic material layer on the first semiconductor layer, forming a second semiconductor layer on the first semiconductor layer and the metallic material layer, dipping the substrate in a solution to remove the metallic material layer and a portion of the first semiconductor layer, forming a third semiconductor layer on the second semiconductor layer, and forming a cavity in the first semiconductor layer under where the metallic layer was removed.

It is to be understood that both the foregoing general description and the following detailed description are exemplary and explanatory and are intended to provide further explanation of the invention as claimed.

BRIEF DESCRIPTION OF THE DRAWINGS

The patent or application file contains at least one drawing executed in color. Copies of this patent or patent application publication with color drawings will be provided by the Office upon request and payment of the necessary fee.

The accompanying drawings, which are included to provide a further understanding of the invention and are incorporated in and constitute a part of this specification, illustrate embodiments of the invention, and together with the description serve to explain the principles of the invention.

FIG. 4 is a SEM micrograph and EDX diagrams of the semiconductor substrate according to the first example, in which (A) is a SEM micrograph of an enlarged region shown in FIG. 2, (B) is an EDX diagram of Ga, (C) is an EDX diagram of Al, and (D) is an EDX diagram of O.

FIG. 5 is SEM micrographs of the semiconductor substrate according to the first example, in which (A) is a SEM micrograph of a side section of the semiconductor substrate and (B) is a SEM micrograph of a surface of the semiconductor substrate.

FIG. 6 is EDX diagrams of the semiconductor substrate according to the first example, in which (A) is an EDX diagram of Ga and (B) is an EDX diagram of Ta.

FIG. 7 is SEM micrographs of a semiconductor substrate according to a first comparative example, in which (A) is a SEM micrograph of the semiconductor substrate shown in a perspective view and (B) is a SEM micrograph of a surface of the semiconductor substrate.

FIG. 8 is an EDX spectrum and EDX diagrams of the semiconductor substrate according to the first comparative example, in which (A) is an EDX spectrum of the substrate of FIG. 7(B), (B) is an EDX diagram of Ga of FIG. 7(B), and (C) is an EDX diagram of N of FIG. 7(B).

FIG. 9 is a SEM micrograph and an EDX spectrum of the semiconductor substrate according to the first comparative example, in which (A) is a SEM micrograph of a side section of a void and (B) is an EDX spectrum of the void of FIG. 9(A).

FIG. 10 is EDX diagrams of the semiconductor substrate according to the first comparative example, in which (A) is an EDX diagram of Ga of FIG. 9(A), (B) is an EDX diagram of N of FIG. 9(A), and (C) is an EDX diagram of Ta of FIG. 9(A).

FIG. 15(A) is a diagram showing an exemplary embodiment of a $Ta_2O_5$ film converted from a 5 nm thick Ta layer, and FIG. 15(B) is a diagram of another showing an exemplary embodiment of a $Ta_2O_5$ film formed on a surface of a 100 nm thick Ta layer.

FIG. 16(A) is a SEM micrograph of a surface of a substrate having a 5 nm thick Ta mask, and FIG. 16(B) is a SEM micrograph of a surface of a substrate having a 10 nm thick Ta2O5 mask.

FIG. 18(A) is a SEM micrograph of a side section of a semiconductor substrate according to a first example of the second exemplary embodiment (that is, a fifth example) and FIG. 18(B) is an optical micrograph of a side section of the semiconductor substrate of the first comparative example.

FIG. 19 is SEM micrographs of a semiconductor substrate according to a second example of the second exemplary embodiment (that is, a sixth example), in which (A) is a SEM micrograph of a side section of the semiconductor substrate formed in a first condition and (B) is a SEM micrograph of a surface of the semiconductor substrate formed in a second condition.

FIG. 26 is SEM micrographs of the semiconductor substrate according to the third exemplary embodiment, in which (A) is a SEM micrograph of a surface of the semiconductor substrate having a portion of the second GaN layer therein, and (B) is a SEM micrograph of a side section of the semiconductor substrate.

FIG. 27 is an optical micrograph and a SEM micrograph of the semiconductor substrate according to the third exemplary embodiment, in which (A) is an optical micrograph of a surface of the semiconductor substrate from which the Ta layer has been removed, and (B) is a SEM micrograph of a side section of the semiconductor substrate having the second GaN layer formed thereon.

DETAILED DESCRIPTION OF THE ILLUSTRATED EMBODIMENTS

Figure 1:
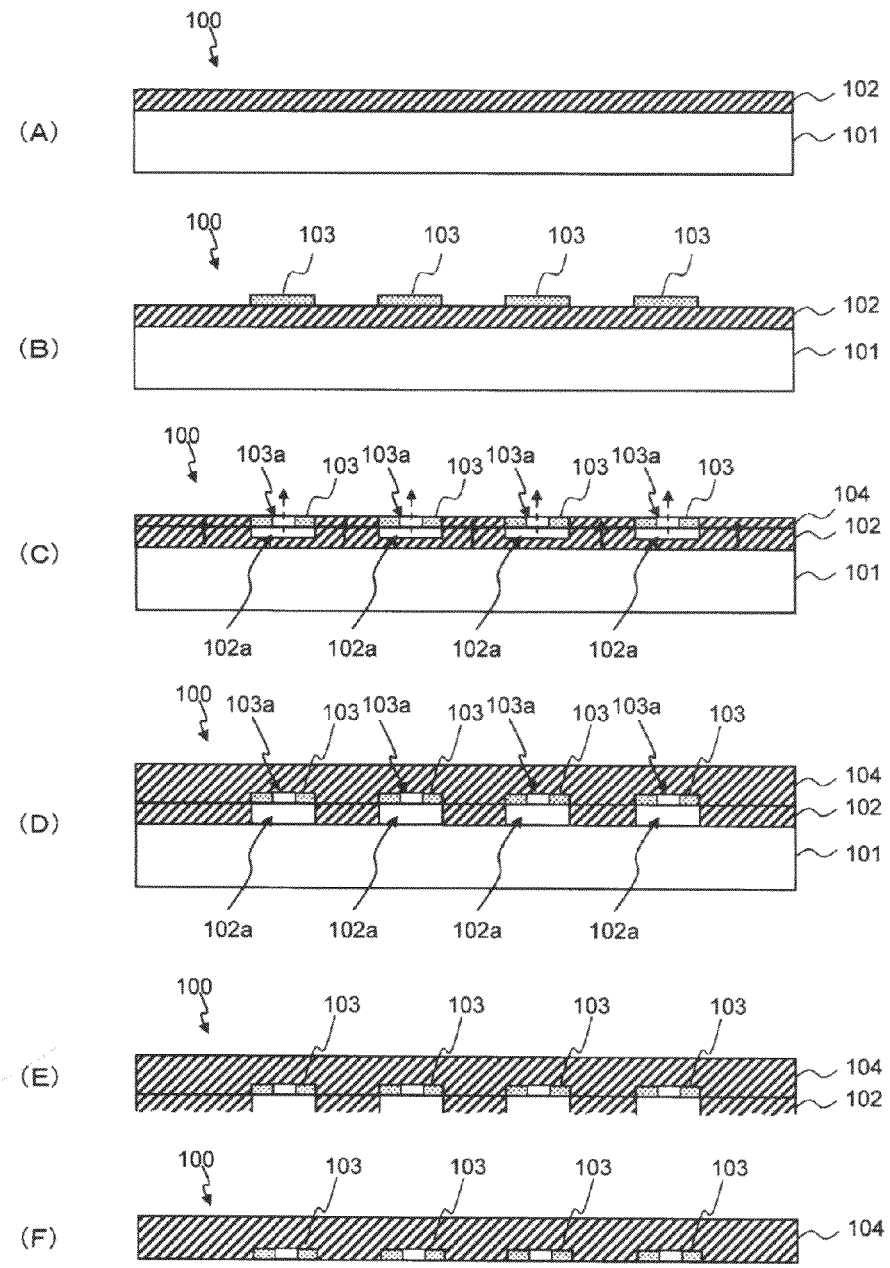
FIG. 1 is a flow diagram of a method of fabricating a semiconductor substrate according to a first exemplary embodiment of the present invention, in which (A) is a sectional view of a process of forming a first GaN layer, (B) is a sectional view of a process of forming a Ta layer, (C) is a sectional view of a process of forming a second GaN layer and a cavity, (D) is a sectional view of a semiconductor substrate after the second GaN layer is formed, (E) is a sectional view of the semiconductor substrate from which a sapphire substrate has been separated from the semiconductor substrate, and (F) is a sectional view of a finished GaN substrate.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

First Exemplary Embodiment

FIG. 1 is a flow diagram of a method of fabricating a semiconductor substrate 100 according to a first exemplary embodiment. In FIG. 1, (A) is a sectional view of a process of forming a first GaN layer, (B) is a sectional view of a process of forming a Ta layer, (C) is a sectional view of a process of forming a second GaN layer and a cavity, (D) is a sectional view of a semiconductor substrate after the second GaN layer is formed, (E) is a sectional view of the semiconductor substrate from which a sapphire substrate has been separated from the semiconductor substrate, and (F) is a sectional view of a finished GaN substrate.

Referring to FIG. 1(A), reference numeral 101 indicates a sapphire ($Al_2O_3$) substrate. First, a first GaN layer 102 having a thickness of about 2 μm is formed on the sapphire substrate 101. The thickness of the first GaN layer 102 is provided as an example.

Next, referring to FIG. 1(B), a Ta layer (metallic material layer) 103 having a thickness of about 50 nm is formed in a shape of stripes, which have a width of 5 μm and are separated a distance of 5 μm from each other, on the first GaN layer 102 by electron beam (EB) deposition and lift-off.

Next, referring to FIG. 1(C), a second GaN layer 104 is formed on the first GaN layer 102 and Ta layer 103 by metal organic chemical vapor deposition (MOCVD). The first GaN layer 102 and the second GaN layer 104 may include semiconductor materials such as AlGaN, InGaN, or AlInGaN. FIG. 1(C) shows the second GaN layer 104 during formation thereof. In the present exemplary embodiment, N in the GaN layer is coupled with Ta to form TaN, which acts as a foreign substance and rises towards a vapor having a higher density of N. The TaN becomes unstable at 900° C. or more, and a hole 103a is deepened to form a cavity 102a depending on the degree of instability. Here, although N in the first GaN layer 102 becomes TaN, Ga remains in the first GaN layer 102. Since this Ga remaining in the first GaN layer 102 is the same as the Ga deposited during vapor deposition, it is used as the raw material. However, GaN may also be grown on a Ta film. As disclosed in Hasegawa, et al., there is a possibility that the surface of the Ta layer 103 becomes not only Ta, but also $Ta_2O_5$ by treatment with air.

Next, referring to FIG. 1(D), once formation of the second GaN layer 104 is completed, the semiconductor substrate 100 is formed. While the second GaN layer 104 is formed by MOCVD, a portion of the first GaN layer 102 under the Ta layer 103 is removed by etching and a formation region of the cavity 102a is extended substantially to the sapphire substrate 101. Further, the surface of the substrate is flattened to progress the growth of the first GaN layer 102 along with the growth of the second GaN layer 104, as shown in FIG. 1(D).

Next, referring to FIG. 1(E), the sapphire substrate 101 is separated from the first GaN layer 102. Then, referring to FIG. 1(F), the GaN substrate 100 may be obtained by polishing the first GaN layer 102, from which the sapphire substrate is removed. The GaN substrate 100 may be used as a semiconductor substrate for devices by attaching a silicon-based substrate such as Si or SiC to an upper surface of the GaN substrate 100 and flattening a lower surface thereof. Separation of the sapphire substrate 101 may be performed by, for example, separation into two substrates, which include the sapphire substrate and a substrate for devices such as a Si or SiC substrate, by a laser lift-off or polishing process. It should be understood that the method of separating the sapphire substrate 101 is not limited to a specific one.

As such, when the semiconductor substrate 100 including the GaN layer is formed by MOCVD, the first GaN layer 102 can be easily separated from the sapphire substrate 101 using the cavity 102a, so that the separated GaN layer can be used as the GaN substrate. Accordingly, the GaN substrate may be manufactured at lower cost than conventional GaN substrates.

Next, detailed examples of the manufacturing method of the semiconductor substrate 100 will be described hereinafter.

First Example of the First Exemplary Embodiment

In a first example of the first exemplary embodiment, the process of forming the second GaN layer 104 using MOCVD will be described. In this example, crystal growth was performed at a temperature of 1045° C. for 5 hours while supplying tri-methyl gallium (TMG) as a raw gas at a flux of 20 μmol/min. Further, in the first example, a 50 nm thick Ta layer 103 was formed in a shape of stripes on the first GaN layer 102.

Figure 2:
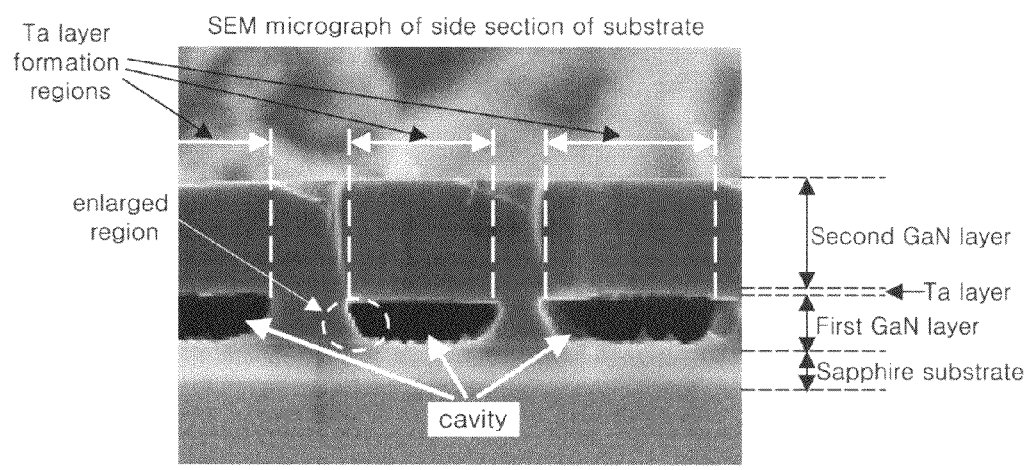
FIG. 2 is a scanning electron microscope (SEM) micrograph of a semiconductor substrate according to a first example of the first exemplary embodiment.

In FIG. 2, the semiconductor substrate 100 with the second GaN layer 104 formed thereon under these conditions is shown. FIG. 2 is a SEM micrograph of a side section of a portion of the semiconductor substrate 100. As shown in FIG. 2, the cavity 102a is formed in a portion of the first GaN layer 102 under the Ta layer 103. An enlarged region including the cavity 102a in FIG. 2 was analyzed using an energy dispersion x-ray spectrometer (EDX), and the analysis result is shown in FIG. 3.

Figure 3:
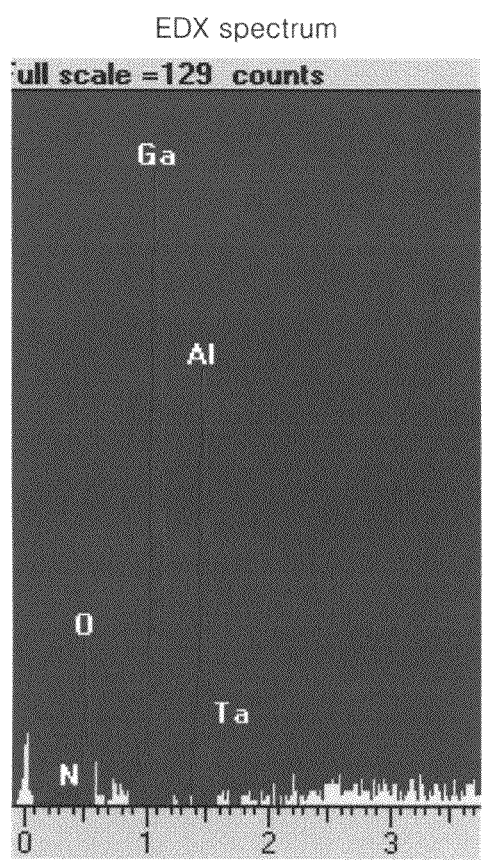
FIG. 3 is an energy dispersive x-ray spectrometer (EDX) spectrum of the semiconductor substrate according to the first example.

In the EDX spectrum of FIG. 3, GaN of the first GaN layer 102, and Al and O of the sapphire substrate 101 are observed, but Ta is not substantially observed. Further, in EDX diagrams of FIG. 4(B), FIG. 4(C), and FIG. 4(D), Ga of the first GaN layer 102, and Al and O of the sapphire substrate 101 are observed, but Ta is not observed.

In the first example, it was observed that holes 103a were formed in the Ta layer 103 during formation of the second GaN layer 104. Analysis results of the holes 103a formed in the Ta layer 103 are shown in FIG. 5 and FIG. 6, and will be described in detail hereinafter. Here, the analysis results shown in FIG. 5 and FIG. 6 were obtained using the EDX by stopping the process of forming the second GaN layer 104 using the MOCVD apparatus.

FIG. 5 shows SEM micrographs of the semiconductor substrate 100, in which (A) is a SEM micrograph of a side section of the semiconductor substrate 100 and (B) is a SEM micrograph of a surface of the semiconductor substrate 100. FIG. 6 is EDX diagrams of the semiconductor substrate 100 of FIG. 5(B), in which (A) is an EDX diagram of Ga and (B) is an EDX diagram of Ta.

In the SEM micrograph of the semiconductor substrate 100 of FIG. 5(A), it is observed that a portion of the first GaN layer 102 under the Ta layer 103 is etched and the cavity 102a is formed therein. In the SEM micrograph of the semiconductor substrate 100 of FIG. 5(B), it is observed that holes 103a are formed on the surface of the Ta layer 103. EDX analysis results for Ga and Ta on the surface of the Ta layer 103 including the holes 103a are shown in FIG. 6(A) and FIG. 6(B). From the EDX diagrams, it can be ascertained that the Ta layer 103 remains and Ga and GaN are thinly grown on the remaining Ta layer 103.

As such, for the semiconductor substrate 100 of the first example, MOCVD conditions for forming the second GaN layer 104 were adjusted to permit the cavity 102a to be formed in the first GaN layer 102 using the Ta layer by etching. Thus, when the second GaN layer 104 was formed as illustrated in the first exemplary embodiment, it was possible to form the cavity 102a in the first GaN layer 102 by etching during growth of the first GaN layer 102. That is, when a metallic material layer was partially formed on the first GaN layer 102, it was possible to form the cavity 102a in the first GaN layer 102.

Here, the MOCVD conditions for the first example are provided as an example, and thus, may be set to allow the growth of the first GaN layer and the formation of the cavity 102a to be simultaneously progressed. Since the growth rate of the first GaN layer 102 was slower than that of the second GaN layer 104, the MOCVD conditions were adjusted in consideration of the growth rate of the first GaN layer 102 in the first example.

Further, in the first example, the holes 103a were formed in the Ta layer 103 during the process of growing the second GaN layer 104, but, for example, the Ta layer 103 may be formed using a mask preformed with holes. The shape of the Ta layer 103 is not limited to the aforementioned stripe shape and may be changed depending on a device structure to be formed on the semiconductor substrate 100. An example of a device formed using the semiconductor substrate 100 will be described below.

Further, the semiconductor substrate 100 of the first example may be reused as a substrate 101 for forming a GaN layer having the aforementioned cavity. In the first example, the GaN substrate may be separated and then a surface of the sapphire substrate 101 on which a new GaN substrate is formed may be flattened by reactive ion etching (RIE) or the like. Hence, manufacturing costs of the GaN substrate can be further reduced.

Second Example of the First Exemplary Embodiment

In a second example of the first exemplary embodiment, the process of forming the second GaN layer 104 under different MOCVD conditions will be described. In this example, crystal growth was performed at a temperature of 1045° C. for 5 hours while supplying TMG as a raw gas at a flux of 20 μmol/min. Further, in the second example, a 30 nm thick Ta layer 103 was formed in a shape of stripes on the first GaN layer 102.

Figure 12:
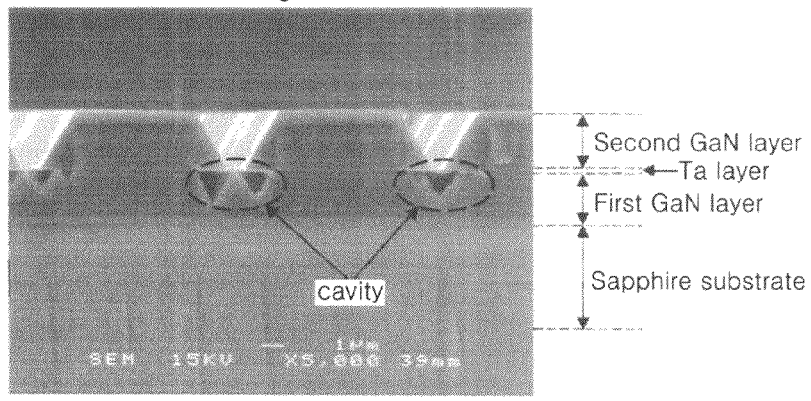
FIG. 12 is a SEM micrograph of a side section of a semiconductor substrate according to a second example of the first exemplary embodiment.

In FIG. 12, the semiconductor substrate 100 with the second GaN layer 104 formed thereon under these conditions is shown. FIG. 12 is a SEM micrograph of a side section of a portion of the semiconductor substrate 100. As shown in FIG.

12, a cavity 102*a* is formed in a portion of the first GaN layer 102 under the Ta layer 103. Further, in the second example, it was observed that holes 103*a* were formed in the Ta layer 103 during formation of the second GaN layer 104.

For the semiconductor substrate 100 of the second example, MOCVD conditions for forming the second GaN layer 104 were adjusted to permit the cavity 102*a* to be formed in the first GaN layer 102 using the Ta layer 103 by etching. Thus, when the second GaN layer 104 is formed as illustrated in the second example, it is possible to form the cavity 102*a* in the first GaN layer 102 by etching during growth of the first GaN layer 102. Namely, when a metallic material layer was partially formed on the first GaN layer 102, it was possible to form the cavity 102*a* in the first GaN layer 102. The metallic material layer may be used for etching the first GaN layer 102 as discussed above in relation to the first exemplary embodiment.

In the sectional view of FIG. 12, the cavities 102*a* formed by etching are not formed in the first GaN layer 102 under the overall lower surface of each of the Ta layers 103, instead being formed under opposite ends of each of the Ta layers 103. FIG. 12 shows that etching is performed in the first GaN layer 102 from the opposite ends of each of the Ta layers 103.

The MOCVD conditions for the second example are provided as an example and may be set to allow the growth of the first GaN layer and the formation of the cavity 102*a* to be simultaneously progressed. Since the growth rate of the first GaN layer 102 is slower than that of the second GaN layer 104, the MOCVD conditions were adjusted in consideration of the growth rate of the first GaN layer 102 in the second example.

Further, in the second example, the holes 103*a* were formed in the Ta layer 103 during the process of growing the second GaN layer 104, but, for example, the Ta layer 103 may be formed using a mask preformed with holes. The shape of the Ta layer 103 is not limited to the aforementioned stripe shape, and may be changed depending on a device structure to be formed on the semiconductor substrate 100. An example of a device formed using the semiconductor substrate 100 will be described below.

Further, the semiconductor substrate 100 of the second example may be reused as a substrate 101 for forming a GaN layer having the aforementioned cavity. In the second example, the GaN substrate may be separated and then a surface of the sapphire substrate 101 on which a new GaN substrate is formed may be flattened by RIE or the like. Hence, manufacturing costs of the GaN substrate can be further reduced.

Third Example of the First Exemplary Embodiment

In a third example of the first exemplary embodiment, the process of forming the second GaN layer 104 using an MOCVD apparatus will be described. In this example, crystal growth was performed at a temperature of 1045° C. for 5 hours while supplying TMG as a raw gas at a flux of 20 μmol/min. Further, in the third example, a 50 nm thick Ta layer 103 was formed in a shape of stripes on the first GaN layer 102.

Figure 13:
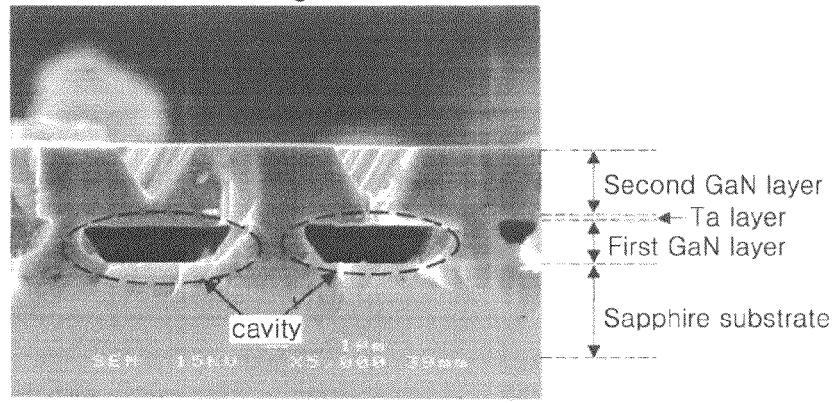
FIG. 13 is a SEM micrograph of a side section of a semiconductor substrate according to a third example of the first exemplary embodiment.

In FIG. 13, the semiconductor substrate 100 with the second GaN layer 104 formed thereon under these conditions is shown. FIG. 13 is an SEM micrograph of a side section of a portion of the semiconductor substrate 100. As shown in FIG. 13, a cavity 102*a* is formed in a portion of the first GaN layer 102 under the Ta layer 103. Further, in the third example, it was observed that holes 103*a* were formed in the Ta layer 103 during formation of the second GaN layer 104.

For the semiconductor substrate 100 of the third example, MOCVD conditions for forming the second GaN layer 104 were adjusted to permit the cavity 102*a* to be formed in the first GaN layer 102 under the Ta layer 103 by etching. Thus, when the second GaN layer 104 was formed as illustrated in the first exemplary embodiment, it was possible to form the cavity 102*a* in the first GaN layer 102 by etching during growth of the first GaN layer 102. In other words, when a metallic material layer was partially formed on the first GaN layer 102, it was possible to form the cavity 102*a* in the first GaN layer 102. The metallic material layer may be used for etching the first GaN layer 102 as discussed above in relation to the first exemplary embodiment.

The MOCVD conditions of the third example are provided as an example and may be set to allow the growth of the first GaN layer 102 and the formation of the cavity 102*a* to be simultaneously progressed. Here, since the growth rate of the first GaN layer 102 is slower than that of the second GaN layer 104, the MOCVD conditions were adjusted in consideration of the growth rate of the first GaN layer 102 in the third example.

Further, in the third example, the holes 103*a* were formed in the Ta layer 103 during the process of growing the second GaN layer 104, but the Ta layer 103 may be formed using a mask preformed with holes. The shape of the Ta layer 103 is not limited to the aforementioned stripe shape and may be changed depending on a device structure to be formed on the semiconductor substrate 100. An example of a device formed using the semiconductor substrate 100 will be described below.

Further, the semiconductor substrate 100 of the third example may be reused as a substrate 101 for forming a GaN layer having the aforementioned cavity. In the third example, the GaN substrate may be separated and then a surface of the sapphire substrate 101 on which a new GaN substrate is formed may be flattened by RIE or the like. Hence, manufacturing costs of the GaN substrate can be further reduced.

Fourth Example of the First Exemplary Embodiment

In a fourth example of the first exemplary embodiment, the process of forming the second GaN layer 104 using an MOCVD APPARATUS will be described. In this example, crystal growth was performed at a temperature of 1045° C. for 5 hours while supplying TMG as a raw gas at a flux of 20 μmol/min. Further, in the fourth example, a 100 nm Ta layer 103 was formed in a shape of stripes on the first GaN layer 102.

Figure 14:
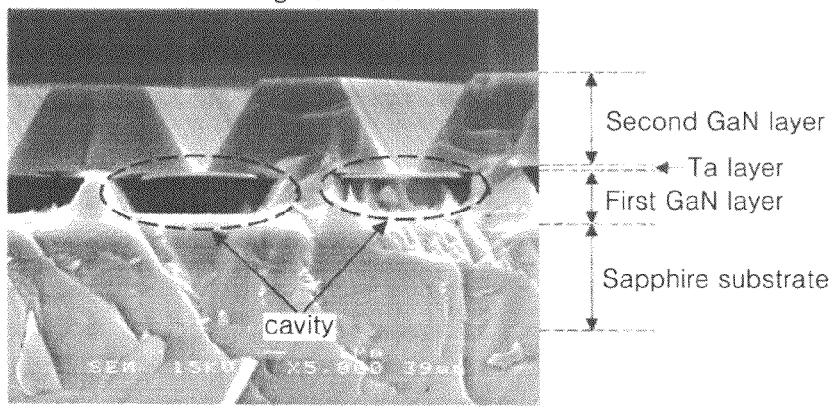
FIG. 14 is a SEM micrograph of a side section of a semiconductor substrate according to a fourth example of the first exemplary embodiment.

In FIG. 14, the semiconductor substrate 100 with the second GaN layer 104 formed thereon under these conditions is shown. FIG. 14 is a SEM micrograph of a side section of a portion of the semiconductor substrate 100. As shown in FIG. 14, a cavity 102*a* is formed in a portion of the first GaN layer 102 under the Ta layer 103. Further, in the fourth example, it was observed that holes 103*a* were formed in the Ta layer 103 during formation of the second GaN layer 104.

For the semiconductor substrate 100 of the fourth example, MOCVD conditions for forming the second GaN layer 104 were adjusted to permit the cavity 102*a* to be formed in the first GaN layer 102 using the Ta layer 103 by etching. Thus, when the second GaN layer 104 was formed as illustrated in the first exemplary embodiment, it was possible to form the cavity 102*a* in the first GaN layer 102 by etching during growth of the first GaN layer 102. Namely, when a metallic material layer was partially formed on the first GaN layer 102, it was possible to form the cavity 102*a* in the first GaN layer 102. The metallic material layer may be used for etching the first GaN layer 102 as discussed above in relation to the first exemplary embodiment.

The MOCVD conditions for the fourth example are provided as an example, and thus, may be set to allow the growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the fourth example.

Further, in the fourth example, the holes 103a were formed in the Ta layer 103 during the process of growing the second GaN layer 104, but, for example, the Ta layer 103 may be formed using a mask preformed with holes. The shape of the Ta layer 103 is not limited to the aforementioned stripe shape and may be changed depending on a device structure to be formed on the semiconductor substrate 100. An example of a device formed using the semiconductor substrate 100 will be described below.

Further, the semiconductor substrate 100 of the fourth example may be reused as a substrate 101 for forming a GaN layer having the aforementioned cavity. In the fourth example, the GaN substrate may be separated and then a surface of the sapphire substrate 101 on which a new GaN substrate is formed may be flattened by RIE or the like. Hence, manufacturing costs of the GaN substrate can be further reduced.

First Comparative Example

A first comparative example will be described hereinafter. In the first comparative example, the process of forming the second GaN layer 104 of the semiconductor substrate 100 under different conditions of the MOCVD apparatus will be described.

In the first comparative example, crystal growth was performed at a temperature of 1045° C. for 5 hours while supplying TMG as a raw gas at a flux of 87 μmol/min.

In FIG. 7, the semiconductor substrate 100 with the second GaN layer 104 formed thereon under these conditions is shown. In FIG. 7, (A) is a SEM micrograph of a side section of a portion of the semiconductor substrate 100 and (B) is a SEM micrograph of a surface of the semiconductor substrate shown in (A). As shown in these micrographs, granular materials are precipitated on the surface of the second GaN layer 104 and a cavity 102a is formed in a portion of the first GaN layer 102 under the Ta layer 103. The following EDX analysis shows that the granular materials are Ga granules, N granules, and Ta granules.

FIG. 8 shows results of EDX analysis on the surface of the granular materials. In FIG. 8, (A) is an EDX spectrum of the granular materials shown in FIG. 7(B), (B) is an EDX diagram of Ga obtained by EDX analysis of the granular materials of FIG. 7(B), and (C) is an EDX diagram of N obtained by EDX analysis of the granular materials of FIG. 7(B). In the EDX spectrum of FIG. 8(A), Ga, N and a trace of Ta are observed, so that Ga and N are observed as shown in the EDX diagrams of FIG. 8(B) and FIG. 8(C).

Results of EDX analysis of cross sections of the granular materials are shown in FIG. 9 and FIG. 10. In FIG. 9, (A) is a SEM micrograph of a side section of a void formed as a granular material shown in FIGS. 7(B) and (B) is an EDX spectrum of the void shown in (A). In FIG. 10, (A) is an EDX diagram of Ga obtained by EDX analysis of the side section of the void of FIG. 9(A), (B) is an EDX diagram of N obtained by EDX analysis on the side section of the void of FIG. 9(A), and (C) is an EDX diagram of Ta obtained by EDX analysis of the side section of the void of FIG. 9(A).

In the spectrum of FIG. 9(B), Ga and N of the second GaN layer 104 and the granular materials, Ta of the Ta layer 103, and Al and O of the sapphire substrate 101 are observed. Further, as shown in (A) to (C) of FIG. 10, Ga, N and Ta are observed at the void.

From these results, it can be ascertained that the granular materials precipitated on the surface of the second GaN layer 104 are Ga granules, N granules, and Ta granules.

Formation of $Ta_2O_5$ region in Ta layer

In the first, second, third, and fourth examples of the first exemplary embodiment, the thickness of the Ta layer 103 was changed to 30 nm, 50 nm, and 100 nm, respectively. It can be ascertained that the cavity 102a was formed in the first GaN layer 104 by etching even when the thickness of the Ta layer 103 was changed in this manner.

FIG. 15 diagrammatically shows that a $Ta_2O_5$ region formed in the Ta layer 103 varies depending on the thickness of the Ta layer 103. FIG. 15(A) shows a $Ta_2O_5$ film converted from a 5 nm thick Ta layer 103 and FIG. 15(B) shows a $Ta_2O_5$ film converted from a surface of a 100 nm thick Ta layer. After depositing the Ta layer 103 on an upper surface of the first GaN layer 102 using an electron beam (EB) deposition apparatus, the Ta layer 103 was transferred to an MOCVD apparatus while being exposed to air. During transfer of the Ta layer 103, the Ta layer 103 was converted into $Ta_2O_5$ by reaction with oxygen. As a result, when the Ta layer 103 was deposited to a thickness of 5 nm as shown in FIG. 15(A), the overall Ta layer 103 was converted into $Ta_2O_5$, and when the Ta layer 103 was deposited to a thickness of 100 nm as shown in FIG. 15(B), the surface of the Ta layer 103 was converted into $Ta_2O_5$. Namely, when Ta contacts air at room temperature, $Ta_2O_5$ may be formed. FIG. 15(A) diagrammatically shows an example of lateral growth of a 5 nm thick Ta layer on a GaN layer. Further, FIG. 16 shows an example of lateral growth of a 10 nm thick $Ta_2O_5$ film on a substrate. In both examples, the growth was progressed without etching of the GaN layer under the Ta layer. In other words, when a substrate having a 5 nm thick Ta layer formed thereon was transferred to the MOCVD apparatus while being exposed to air, a 5 nm thick $Ta_2O_5$ film was formed on the substrate in FIG. 15(A). The $Ta_2O_5$ film was a very good mask which was laterally grown. On the other hand, when the 100 nm thick Ta layer was deposited as shown in FIG. 15(B), the result was different. When the Ta layer is deposited by EB deposition, a raw material of Ta is positioned in air and a thin oxide film is thus formed on the Ta layer. As Ta is further deposited, it is converted initially into $Ta_2O_5$, but conversion into $Ta_2O_5$ gradually slows to allow deposition of Ta. The $Ta_2O_5$ film has a thickness of 5 nm or less on the GaN layer and contains a portion composed of Ta. An upper layer of the $Ta_2O_5$ film is composed of Ta. Further, as the substrate having the Ta layer thereon is transferred to the MOCVD apparatus while being exposed to air, a thin $Ta_2O_5$ film is formed on the surface of the Ta layer. As a result, the surface of the Ta layer is covered with the thin $Ta_2O_5$ film. In this Ta layer, the $Ta_2O_5$ film on the GaN layer is partially mixed with Ta. This result is diagrammatically shown in FIG. 15(B). Although N of the GaN layer and Ta of the Ta layer are coupled to form TaN, Ga is still used as the raw material, since Ga is the same as the Ga deposited during vapor deposition.

In the first, second, third, and fourth examples of the first exemplary embodiment, a $Ta_2O_5$ region formed by oxidation of the Ta layer 103 was laterally grown with respect to the first GaN layer 102 and serves as a very good etching mask. As a result, in the second example, as shown in FIG. 12, it was ascertained that the $Ta_2O_5$ region was not formed at the opposite ends of the 30 nm thick Ta layer 103, and the formation of the cavity 102a was progressed from portions of the first GaN layer 102 under the opposite ends of the Ta layer 103. In both the third and fourth examples, in which the Ta layers 103 were formed to a thickness of 50 nm and a thickness of 100 nm, respectively, the formation of the cavity 102a was progressed as in the second example, since the $Ta_2O_5$ region was formed on the surface of the Ta layer to act as the etching mask with respect to the first GaN layer 102.

Thus, as in the first, second, third, and fourth examples of the first exemplary embodiment, the thickness of the Ta layer 103 may be in the range of 20~100 nm in order to permit formation of the $Ta_2O_5$ region, which acts as the etching mask. Further, in FIG. 16(A), which shows an example of a 5 nm thick Ta mask on the first GaN layer, the cavity 102a is not formed under the Ta mask. Further, in FIG. 16(B), which shows an example of forming only the $Ta_2O_5$ mask, it could be ascertained that the $Ta_2O_5$ mask was formed on the GaN layer and InGaAlN layer. Accordingly, since the $Ta_2O_5$ mask is formed regardless of the thickness of the Ta layer 103, it is possible to progress formation of the cavity 102a in the first GaN layer 102 under the $Ta_2O_5$ mask.

Second Exemplary Embodiment

In the first exemplary embodiment, the Ta layer 103 is formed in the shape of stripes on the first GaN layer 102 and the cavity 102a is formed in a portion of the first GaN layer 102 under the Ta layer 103 by allowing the Ta layer 103 to act as an etching mask. In a second exemplary embodiment, Ti and Cr are used as materials for the etching mask.

Figure 17:
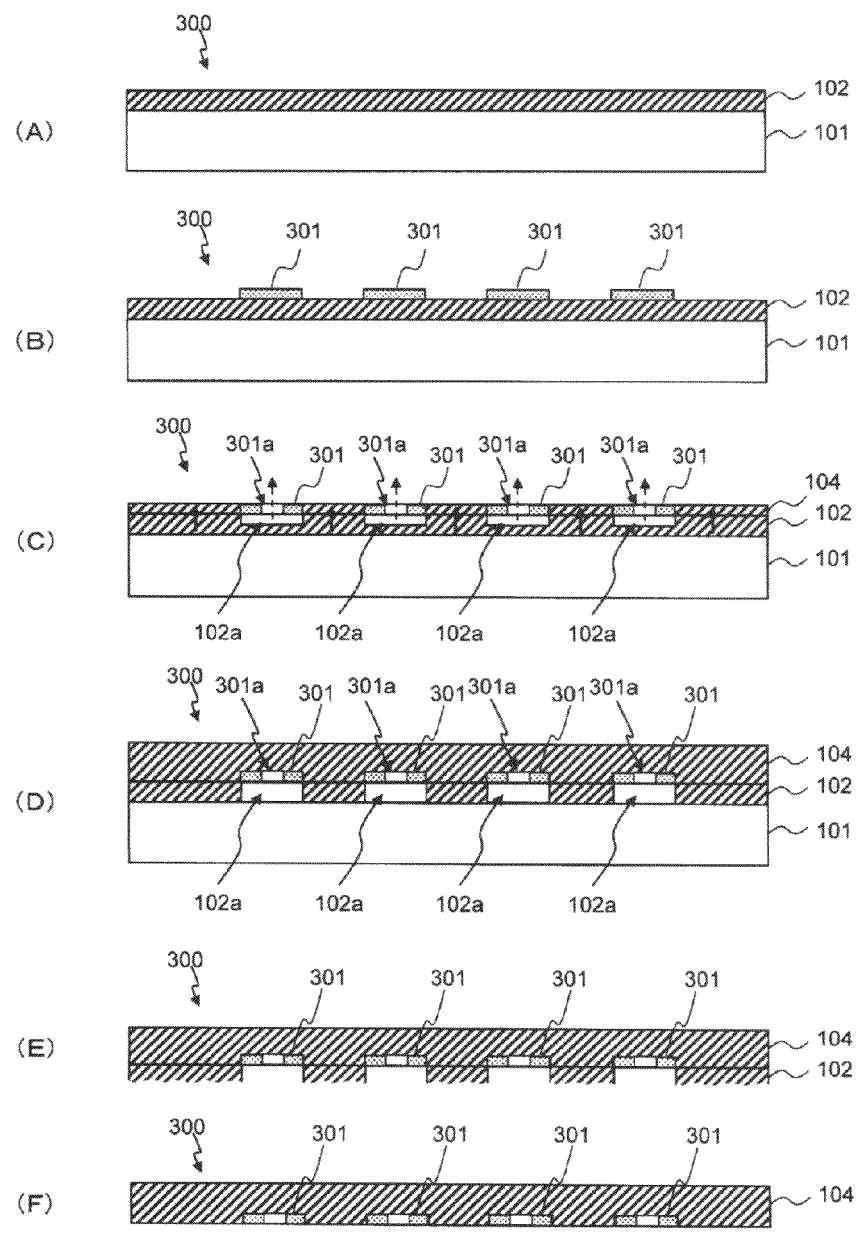
FIG. 17 is a flow diagram of a method of fabricating a semiconductor substrate according to a second exemplary embodiment of the invention, in which (A) is a sectional view of a process of forming a first GaN layer, (B) is a sectional view of a process of forming a Ta layer, (C) is a sectional view of a process of forming a second GaN layer and a cavity, (D) is a sectional view of a semiconductor substrate after the second GaN layer is formed, (E) is a sectional view of the semiconductor substrate from which a sapphire substrate is separated, and (F) is a sectional view of a finished GaN substrate.

FIG. 17 is a flow diagram of a method of fabricating a semiconductor substrate 300 in accordance with the second exemplary embodiment. In FIG. 17, (A) is a sectional view of a process of forming a first GaN layer, (B) is a sectional view of a process of forming a Ti (or Cr) layer, (C) is a sectional view of a process of forming a second GaN layer and a cavity, (D) is a sectional view of a semiconductor substrate after the second GaN layer is formed, (E) is a sectional view of the semiconductor substrate from which a sapphire substrate has been separated, and (F) is a sectional view of a finished GaN substrate. In the description of the second exemplary embodiment as shown in FIG. 17, the same components of the semiconductor substrate as those of the first exemplary embodiment will be denoted by the same reference numerals as those shown in FIG. 1.

Referring to FIG. 17(A), reference numeral 101 indicates a sapphire ($Al_2O_3$) substrate. First, a first GaN layer 102 is formed to a thickness of about 2 μm on the sapphire substrate 101. This thickness of the first GaN layer 102 is provided as an example.

Next, referring to FIG. 17(B), a Ti layer (metallic material layer) 301 having a thickness of about 50 nm is formed in a shape of stripes, which have a width of 5 μm and are is separated a distance of 5 μm from each other, on the first GaN layer 102 by electron beam (EB) deposition and lift-off. The shape, thickness, width, and distance of the Ti layer 301 are provided as one example.

Next, referring to FIG. 17(C), a second GaN layer 104 is formed on the first GaN layer 102 and the Ti layer 301 by MOCVD. The first GaN layer 102 and the second GaN layer 104 may include semiconductor materials such as AlGaN, InGaN, or AlInGaN. FIG. 17(C) shows the second GaN layer 104 during formation thereof. In the present exemplary embodiment, N in the first GaN layer 102 combines with Ti to form TiN, which acts as foreign matter and rises towards a vapor having a higher density of N. The TiN becomes unstable at 900° C. or more, and holes 301a are deepened to form cavities 102a depending on the degree of instability. Here, although N in the first GaN layer 102 becomes TiN, Ga remains in the first GaN layer 102. Since this Ga remaining in the first GaN layer 102 is the same as Ga deposited during the vapor deposition, it is used as the raw material.

Next, referring to FIG. 17(D), once formation of the second GaN layer 104 is completed, a semiconductor substrate 300 is formed. While formation of the second GaN layer 104 is progressed by MOCVD, a portion of the first GaN layer 102 under the Ti layer 301 is removed by etching and a formation region of the cavity 102a is extended substantially to the sapphire substrate 101. Further, since the growth of the first GaN layer 102 is progressed together with the growth of the second GaN layer 104, the surface of the substrate is flattened as shown in FIG. 17. Thus, it is possible to omit the process of flattening the substrate surface in the semiconductor substrate 300 of this embodiment.

Next, FIGS. 17(E) and 17(F) show a process of separating the sapphire substrate 101 and a process of polishing the first GaN layer 102 separated from the sapphire substrate 101, which are the same as those described with reference to FIGS. 1(E) and 1(F). A detailed description thereof will be omitted herein.

As such, when the semiconductor substrate 300 including the GaN layer is formed by MOCVD, the first GaN layer 102 can be easily separated from the sapphire substrate 101 using the cavity 102a, and the separated GaN layer can be used as the GaN substrate 300. Therefore, the GaN substrate 300 may be manufactured at lower costs than the conventional GaN substrate. The manufacturing method of the semiconductor substrate 300 shown in FIG. 17 may also be applied to the case where Cr is used as a material for the etching mask, and descriptions thereof will be omitted herein. Namely, a Cr layer may be formed as an etching mask in a shape of stripes on the first GaN layer 102 to form the semiconductor substrate 300 having the GaN layer using MOCVD, thereby producing the semiconductor substrate 300 that permits separation of the first GaN layer 102 from the sapphire substrate 101 using the cavity 102a. A detailed example of the manufacturing method of the semiconductor substrate 300 will be described hereinafter in a first example of the second exemplary embodiment (the fifth example), in which Cr is used as a material for the etching mask.

Fifth Example

Next, detailed examples of the manufacturing method of the semiconductor substrate 300 having the Ti layer 301 formed thereon will be described hereinafter. In a first example of the second exemplary embodiment (that is, the fifth example), the process of forming the second GaN layer 104 using an MOCVD apparatus will be described. In this example, crystal growth was performed at a temperature of 1045° C. for 50 minutes while supplying TMG as a raw gas at a flux of 80 μmol/min. Further, in the fifth example, a 50 nm thick Ti layer 301 was formed in a shape of stripes on the first GaN layer 102.

In FIG. 18(A), the semiconductor substrate 300 with the second GaN layer 104 formed thereon under these conditions is shown. FIG. 18(A) is a SEM micrograph of a side section of a portion of the semiconductor substrate 300. As seen in FIG. 18(A), the cavity 102a is formed in a portion of the first GaN layer 102 under the Ti layer 301. Further, in the fifth example, it was observed that holes 301a were formed in the Ti layer 301 during formation of the second GaN layer 104 (see FIG. 17(C) and FIG. 17(D)).

For the semiconductor substrate 300 of the fifth example, MOCVD conditions for forming the second GaN layer 104 were adjusted to permit the cavity 102a to be formed in the first GaN layer 102 using the Ti layer 301 by etching. Thus, when the second GaN layer 104 was formed as illustrated in the second exemplary embodiment, it was possible to form the cavity 102a in the first GaN layer 102 by etching during growth of the first GaN layer 102. Namely, when the Ti layer 301 as a metallic material layer was partially formed on the first GaN layer 102, it was possible to form the cavity 102a in the first GaN layer 102. The Ti metallic material layer may be used to etch the first GaN layer 102 as described above.

The MOCVD conditions for the fifth example are provided as an example, and thus, any condition may be used so long as the conditions are set to allow growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the fifth example.

Further, in the second exemplary embodiment, the holes 301a were formed in the Ti layer 301 during the process of growing the second GaN layer 104, but, for example, the Ti layer 301 may be formed using a mask preformed with holes. The shape of the Ti layer 301 is not limited to the aforementioned stripe shape, and may be changed depending on a device structure to be formed on the semiconductor substrate 300. An example of a device formed using the semiconductor substrate 300 will be described below.

Further, the semiconductor substrate 300 of the second exemplary embodiment may be reused as a substrate 101 for forming a GaN layer having the aforementioned cavity. In this case, the GaN substrate may be separated and then a surface of the sapphire substrate 101 on which a new GaN substrate is formed may be flattened by RIE or the like. Hence, manufacturing costs of the GaN substrate can be further reduced.

Second Comparative Example

A second comparative example relating to the fifth example will be described hereinafter. In the second comparative example, the process of forming the second GaN layer 104 of the semiconductor substrate 300 under different MOCVD conditions by changing the thickness of the Ti layer 301 will be described.

In the second comparative example, crystal growth was performed at a temperature of 1120° C. for 5 hours while supplying TMG as a raw gas at a flux of 20 μmol/min. FIG. 18(B) shows the semiconductor substrate 300 having the second GaN layer 104 formed thereon under these conditions. In FIG. 18(B), the Ti layer 301 has a thickness of 10 nm. In this case, the cavity 102a is not formed in the first GaN layer 102 under the Ti layer 301.

Accordingly, it can be ascertained that when Ti is used as the material for the etching mask, a preferred thickness of the Ti layer 301 permitting the formation of the cavity 102a in the first GaN layer 102 is 50 nm or more, and a preferred flux X of TMG is lower than 80 μmol/min (that is, X<80 μmol/min).

Sixth Example

A detailed example of the manufacturing method of the semiconductor substrate 300 having the Cr layer formed thereon will be described hereinafter. In a first condition of a second example of the second exemplary embodiment (the sixth example), the process of forming the second GaN layer 104 using the MOCVD apparatus will be described. In the first condition, crystal growth was performed at a temperature of 1060° C. for 40 minutes while supplying TMG as a raw gas at a flux of 80 μmol/min. Further, in the first condition of the sixth example, a 23 nm thick Cr layer was formed in a shape of stripes on the first GaN layer 102.

In FIG. 19(A), the semiconductor substrate 300 with the second GaN layer 104 formed thereon under the first condition is shown. FIG. 19(A) is a SEM micrograph of a side section of a portion of the semiconductor substrate 300. As shown in this figure, the cavity 102a is formed in a portion of the first GaN layer 102 under the Cr layer.

In a second condition of the sixth example, crystal growth was performed at a temperature of 1045° C. for 40 minutes while supplying TMG as a raw gas at a flux of 80 μmol/min. Further, in the second condition of the sixth example, a 50 nm thick Cr layer was formed in a shape of stripes on the first GaN layer 102.

In FIG. 19(B), the semiconductor substrate 300 with the second GaN layer 104 formed thereon under the second condition is shown. FIG. 19(B) is a SEM micrograph of a side section of a portion of the semiconductor substrate 300. As shown in FIG. 19(B), the cavity 102a is formed in a portion of the first GaN layer 102 under the Cr layer.

For the semiconductor substrate 300 of the sixth example, the MOCVD conditions for forming the second GaN layer 104 were adjusted to permit the cavity 102a to be formed in the first GaN layer 102 using the Cr layer by etching. Thus, when the second GaN layer 104 was formed as illustrated in second exemplary embodiment, it was possible to form the cavity 102a in the first GaN layer 102 by etching during growth of the first GaN layer 102. In other words, when the Cr layer as a metallic material layer was partially formed on the first GaN layer 102, it was possible to form the cavity 102a in the first GaN layer 102. The Cr metallic material layer may be used for etching the first GaN layer 102 as discussed above.

Further, the MOCVD conditions for the sixth example are provided as examples, and thus, any condition may be used so long as the condition is set to allow the growth of the first GaN layer and the formation of the cavity 102a to be simultaneously progressed. Here, since the growth rate of the first GaN layer 102 is slower than that of the second GaN layer 104, the MOCVD conditions were adjusted in consideration of the growth rate of the first GaN layer 102 in the sixth example.

Third Comparative Example

A third comparative example will be described hereinafter. In the third comparative example, the semiconductor substrate is formed by forming a metallic material layer other than the Ti layer and the Cr layer, which are formed in the fifth and sixth examples, respectively.

Figure 20:
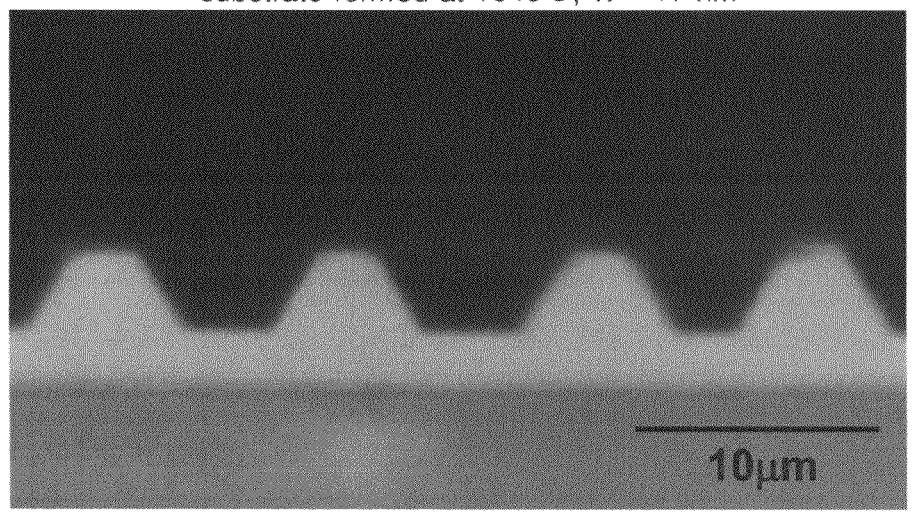
FIG. 20 is an optical micrograph of a side section of a semiconductor substrate according to a second comparative example formed using a tungsten (W) layer.

FIG. 20 is an optical micrograph of a side section of a semiconductor substrate using a tungsten (W) layer as the metallic material layer. For this semiconductor substrate, a 17 nm thick W layer was formed as the metallic material layer in a shape of stripes on a first GaN layer, and a second GaN layer was formed by crystal growth at a temperature of 1045° C. for 40 minutes while supplying TMG as a raw gas at a flux of 80 μmol/min into an MOCVD apparatus. In this case, no cavity was formed in a portion of the first GaN layer under the W layer.

Figure 21:
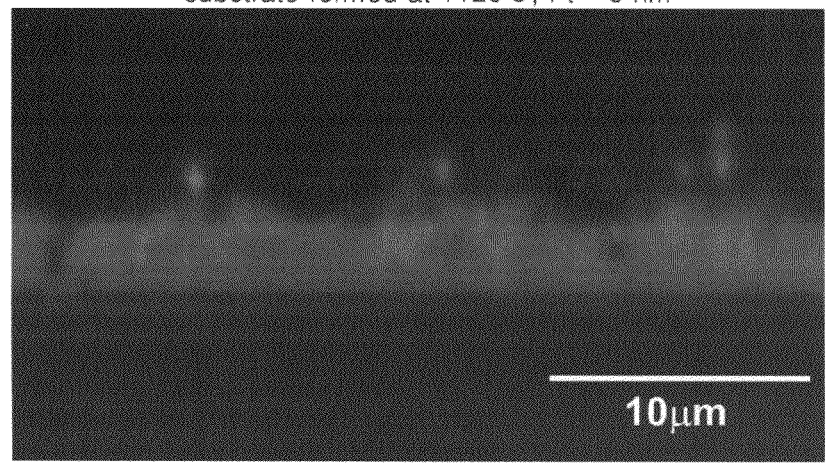
FIG. 21 is an optical micrograph of a side section of the semiconductor substrate according to the second comparative example formed using a platinum (Pt) layer.

FIG. 21 is an optical micrograph of a side section of a semiconductor substrate using a platinum (Pt) layer as the metallic material layer. For this semiconductor substrate, an 8 nm thick Pt layer was formed as the metallic material layer in a shape of stripes on a first GaN layer, and a second GaN layer was formed by crystal growth at a temperature of 1120° C. for 40 minutes while supplying TMG at a flux of 80 μmol/min into an MOCVD apparatus. In this case, no cavity was formed in a portion of the first GaN layer under the Pt layer.

Figure 22:
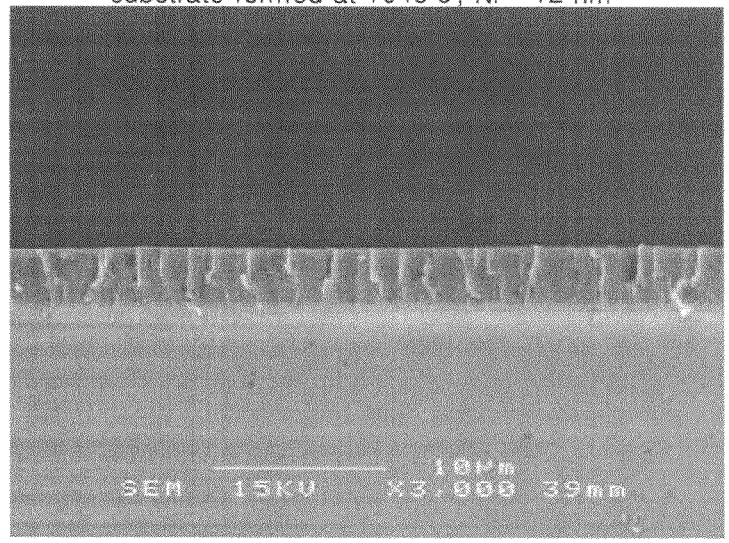
FIG. 22 is a SEM micrograph of a side section of the semiconductor substrate according to the second comparative example formed using a nickel (Ni) layer.

FIG. 22 is a SEM micrograph of a side section of a semiconductor substrate using a nickel (Ni) layer as the metallic material layer. For this semiconductor substrate, a 12 nm thick Ni layer was formed as the metallic material layer in a shape of stripes on a first GaN layer, and a second GaN layer was formed by crystal growth at a temperature of 1045° C. for 40 minutes while supplying TMG at a flux of 80 μmol/min into an MOCVD apparatus. In this case, no cavity was formed in a portion of the first GaN layer under the Ni layer.

Figure 23:
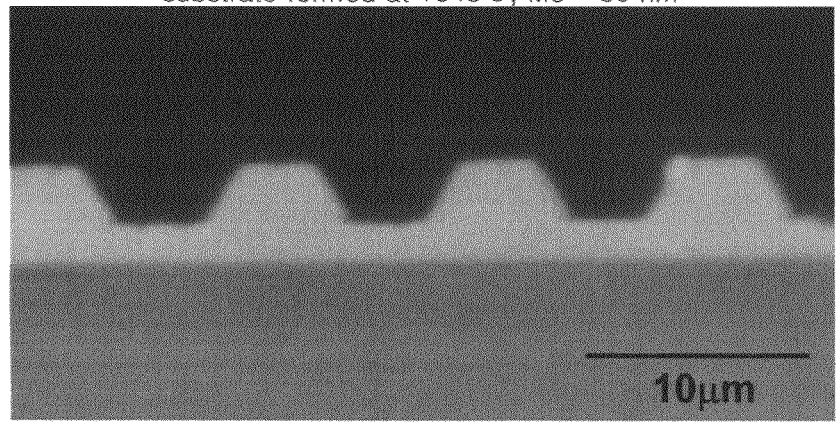
FIG. 23 is an optical micrograph of a side section of the semiconductor substrate according to the second comparative example formed using a molybdenum (Mo) layer.

FIG. 23 is an optical micrograph of a side section of a semiconductor substrate using a molybdenum (Mo) layer as the metallic material layer. For this semiconductor substrate, a 30 nm thick Mo layer was formed as the metallic material layer in a shape of stripes on a first GaN layer and a second GaN layer was formed by crystal growth at a temperature of 1045° C. for 40 minutes while supplying TMG at a flux of 80 μmol/min into an MOCVD apparatus. In this case, no cavity was formed in a portion of the first GaN layer under the Mo layer.

As such, when using the W layer, Pt layer, Ni layer, and Mo layer as the metallic material layer, no cavity was formed in the portion of the first GaN layer 102 under the metallic layer, and thus, the semiconductor substrate enabling the first GaN layer 102 to be separated from the sapphire substrate using the cavity was not manufactured.

Further, in the semiconductor substrates 100 and 300 of the first and second embodiments, the Ta layer 103, the Ti layer 301, and the Cr layer are formed as the metallic material layer in the shape of stripes on the first GaN layer 102, but a material for an underlayer of the metallic material layer is not limited to GaN. That is, any material comprising N, which reacts with the metallic material layer, may be used. For example, InGaAlN may be used as the material for the underlayer of the metallic material layer.

Third Exemplary Embodiment

In a third exemplary embodiment, when forming the second GaN layer, a portion of the second GaN layer is initially formed on the first GaN layer and the Ta layer, and an additional second GaN layer is formed by ultrasound cleaning the semiconductor substrate to remove the Ta layer.

Figure 24A:
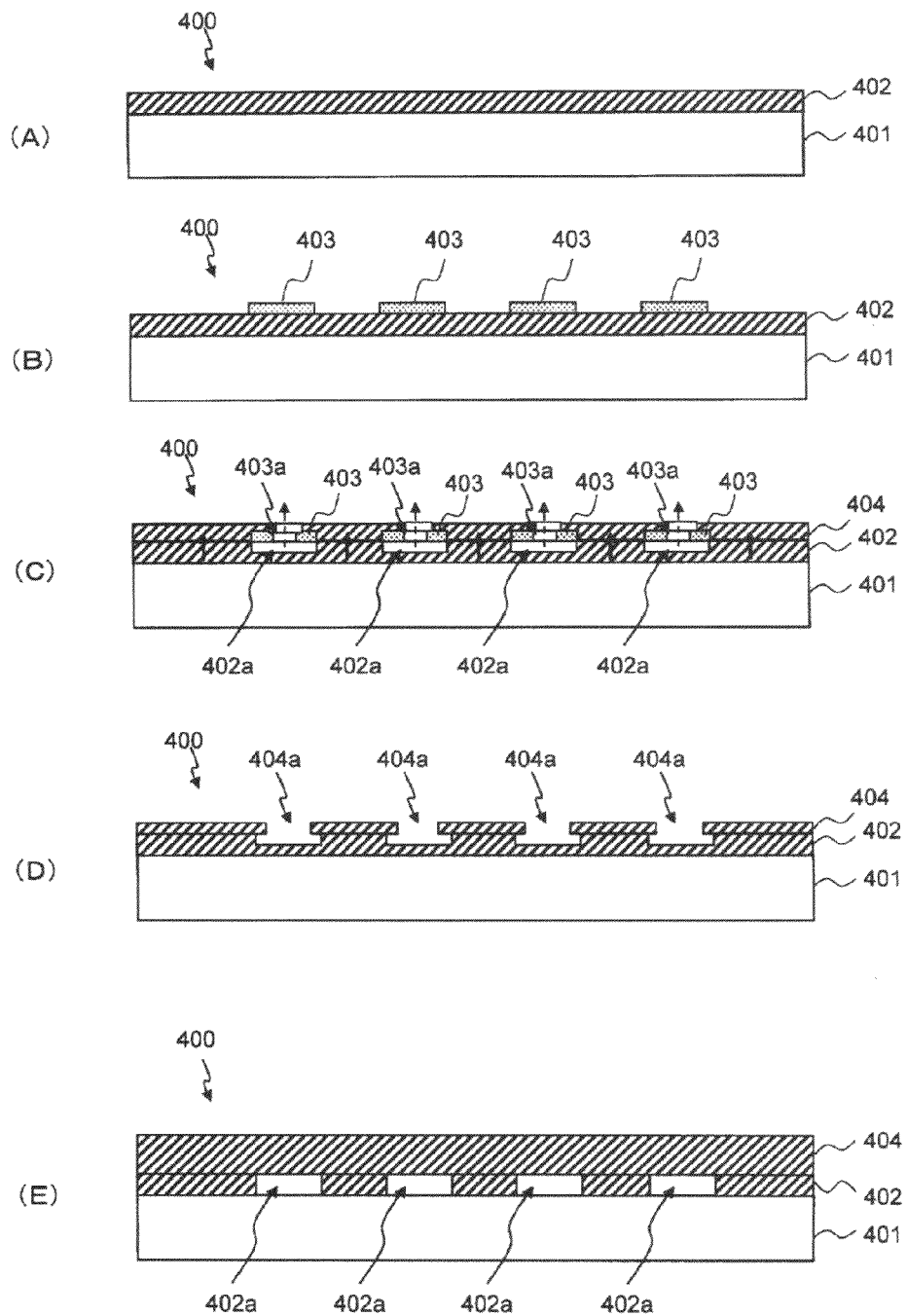
FIG. 24a is a flow diagram of a method of fabricating a semiconductor substrate according to a third exemplary embodiment, in which (A) is a sectional view of a process of forming a first GaN layer, (B) is a sectional view of a process of forming a Ta layer, (C) is a sectional view of a process of forming a second GaN layer and a cavity, (D) is a sectional view of the second GaN layer, from which the Ta layer has been removed by ultrasound cleaning, and (E) is a sectional view of a semiconductor substrate after the second GaN layer is formed.

FIG. 24a is a flow diagram of a method of fabricating a semiconductor substrate 400 in accordance with the third exemplary embodiment. In FIG. 24a, (A) is a sectional view of a process of forming a first GaN layer, (B) is a sectional view of a process of forming a Ta layer, (C) is a sectional view of a process of forming a second GaN layer and a cavity, (D) is a sectional view of the second GaN layer, from which the Ta layer has been removed by ultrasound cleaning, and (E) is a sectional view of a semiconductor substrate after the second GaN layer is formed, and (E) is a sectional view of a finished GaN substrate.

Referring to FIG. 24a(A), reference numeral 401 indicates a sapphire (Al₂O₃) substrate. First, a first GaN layer 402 having a thickness of about 2 μm is formed on the sapphire substrate 401. This thickness of the first GaN layer 402 is provided as an example.

Next, referring to FIG. 24a(B), a Ta layer (metallic material layer) 403 having a thickness of about 5 μm is formed in a shape of stripes, which have a width of 5 μm and are separated a distance of 5 μm from each other, on the first GaN layer 402 by electron beam (EB) deposition and lift-off. The shape, thickness, width, and distance of the Ta layer 403 are provided as one example.

Referring to FIG. 24a(C), a portion of a second GaN layer 404 is formed on the first GaN layer 402 and the Ta layer 403. The first GaN layer 402 and the second GaN layer 404 may include semiconductor materials such as AlGaN, InGaN, or AlInGaN. In order to form this second GaN layer 404, a semiconductor substrate 400 having the Ta layer 403 formed on the first GaN layer 402 in FIG. 24a (B) is placed in an MOCVD apparatus (not shown), and is heated at 1000° C. for 20 minutes at a pressure of 500 Torr in the MOCVD apparatus while supplying NH₃ gas at a flux of 0.4 mol/min thereto. FIG. 26(A) is a SEM micrograph of a surface of the semiconductor substrate 400 having the portion of the second GaN layer 404 formed by this process. FIG. 26(B) is a SEM micrograph of a side section of this semiconductor substrate. In the present exemplary embodiment, the semiconductor substrate 400 has an irregular surface. In this process, although TMG is not supplied as the raw material while supplying the NH₃ gas, the second GaN layer is grown, as shown in FIG. 26(B). The reason behind this is that, in the MOCVD apparatus, Ga of the first GaN layer 402 is dispersed in the MOCVD apparatus and reacts with the NH₃ gas at 1000° C. or more to form GaN again, thereby allowing growth of the second GaN layer 404. Further, TaN becomes unstable at 900° C. or more, and holes are deepened to form cavities 402a depending on the degree of instability. Here, although N in the first GaN layer 402 forms TaN, Ga remains in the first GaN layer 402. Since this Ga remaining in the first GaN layer 402 is the same as Ga deposited during vapor deposition, it is used as the raw material. Further, when forming the portion of the second GaN layer 404, TMG may be used as the raw material instead of the NH₃ gas as in the first exemplary embodiment. For example, the portion of the second GaN layer 404 may be formed by crystal growth at a heating temperature of 1045° C. while supplying TMG at a flux of 20 μmol/min in the MOCVD apparatus.

Next, referring to FIG. 24a(D), the semiconductor substrate 400, on which the portion of the second GaN layer 404 is formed to form an irregular surface as shown in FIG. 24a(C), is removed from the MOCVD apparatus, and the surface of the semiconductor substrate 400 is then cleaned using pure water for 15 minutes at 45 kHz using an ultrasound washer (not shown). The Ta layer 403 is removed through such ultrasound cleaning. In this case, since Ta is not dissolved in water, it is believed that Ta is destroyed by vibration during ultrasound cleaning. FIG. 27(A) is an optical micrograph of the surface of the semiconductor substrate 400, from which the Ta layer 403 has been removed. As shown in FIG. 27(A), since the Ta layer 403 is removed, the sapphire substrate 401 and the first GaN layer 402 remain on the surface of the semiconductor substrate 400. In this case, after the Ta layer 403 is removed, the holes 404a are emptied, allowing the first GaN layer to be seen on the surface of the semiconductor substrate and making the surface of the semiconductor substrate more irregular. Further, the hole (indicated by D in FIG. 27(A)) emptied by the removal of the Ta layer 403 has a width of 4 μm. Although the semiconductor substrate 400 is cleaned by ultrasound cleaning with pure water in the present exemplary embodiment, the semiconductor substrate 400 may also be cleaned by ultrasound cleaning in a solution that dissolves the Ta layer 403 and does not dissolve the first GaN layer 402 and the second GaN layer 404. The solution may be water, a mixture of water and hydrochloric acid, a mixture of water and sulfuric acid, a mixture of water and acetic acid, a mixture of water and hydrofluoric acid, a mixture of water and sodium hydroxide, a mixture of water and potassium hydroxide (here, the amount of water is in the range of 0~90%), and the like.

Next, referring to FIG. 24a(E), an additional second GaN layer 404 is formed on the first GaN layer 402 of the semiconductor substrate 400, which has an irregular surface, using the MOCVD apparatus. The additional second GaN layer 404 is formed to a thickness of 4.5 μm by heating at 1040° C. for 1 hour at a pressure of 500 Torr in the MOCVD apparatus while supplying TMG as the raw gas at a flux of 160 mmol/min to the MOCVD apparatus. FIG. 26(B) is a SEM micrograph of a side section of the semiconductor substrate which has the portion of the second GaN layer 404 formed on the semiconductor substrate by this process. As shown in FIG. 26(B), a cavity is formed in a portion of the first GaN layer 402 under a region from which the Ta layer 403 is removed, and the surface of the second GaN layer 404 is flattened. Further, in this process, since the Ta layer is previously removed, the granular materials as described in the first exemplary embodiment are not precipitated on the surface of the semiconductor substrate.

Figure 24B:
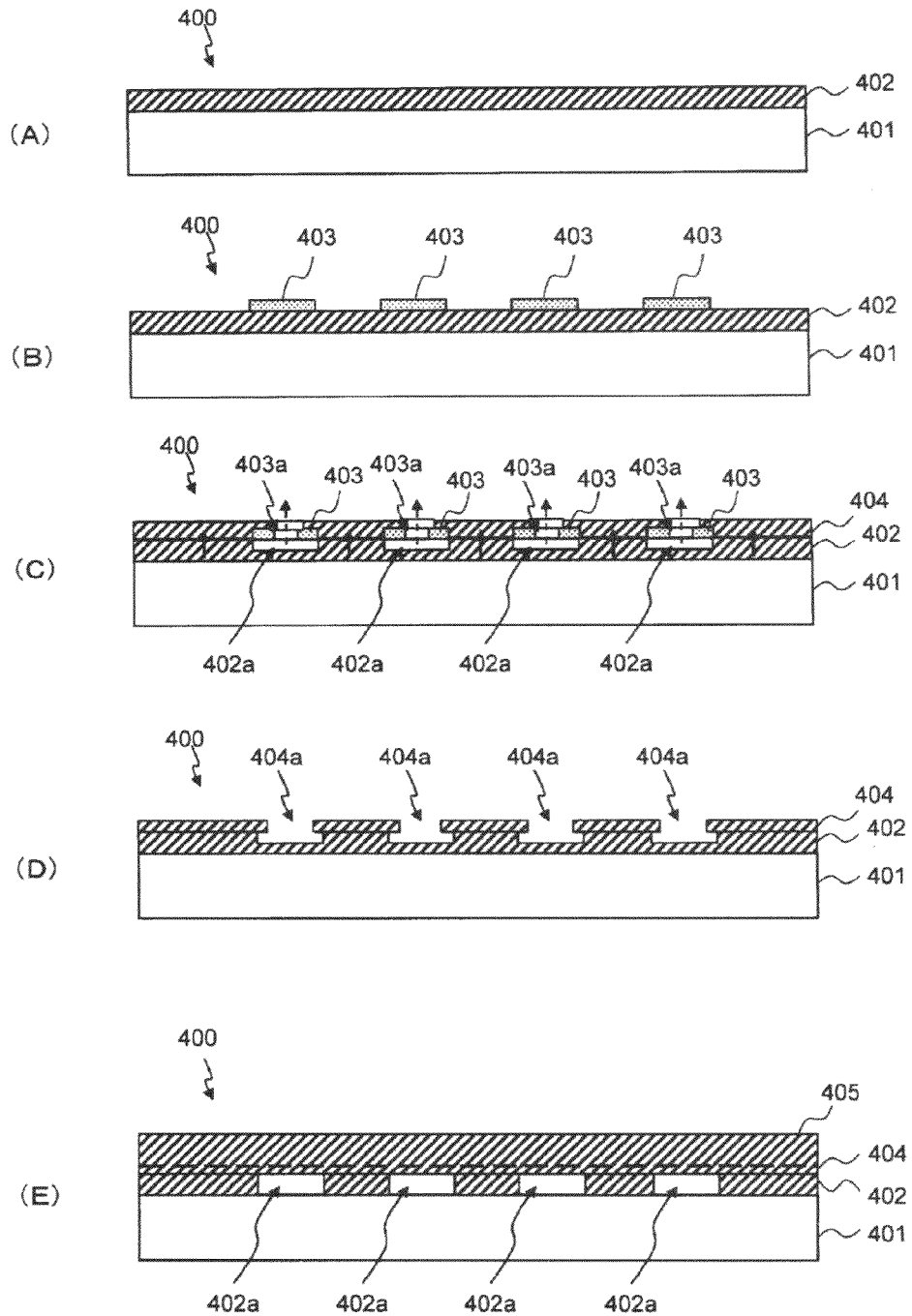
FIG. 24b is a flow diagram of the method of fabricating a semiconductor substrate according to the third exemplary embodiment, in which (A) is a sectional view of a process of forming a first GaN layer, (B) is a sectional view of a process of forming a Ta layer, (C) is a sectional view of a process of forming a second GaN layer and a cavity, (D) is a sectional view of the second GaN layer, from which the Ta layer has been removed by ultrasound cleaning, and (E) is a sectional view of a semiconductor substrate after a third GaN layer is formed.

Further, in FIG. 24a(C), since the portion of the second GaN layer 404 is formed on the first GaN layer 402, this portion has no defects. As a result, an interlayer border is not formed between the portion of the second GaN layer and the additional second GaN layer 404 formed thereon in FIG. 24a(E). In an alternative example, the portion of the second GaN layer 404 formed in FIG. 24a(C) may be defined as the second GaN layer and the additional second GaN layer 404 formed in FIG. 24a(E) may be defined as a third GaN layer 405. FIG. 24b shows this example.

In FIG. 24b, the respective processes shown in (A) to (E) are the same as (A) to (E) of FIG. 24a, and descriptions thereof will be omitted herein. FIG. 24b(E) shows a structural difference of the second GaN layer from that shown in FIG. 24a(E). In FIG. 24b(E), a GaN layer formed in the process of FIG. 24b(C) is shown as the second GaN layer 404 and a GaN layer formed in the process of FIG. 24b(E) is shown as the third GaN layer 405 (third semiconductor layer). In FIG. 24b(E), a border between the second GaN layer 404 and the third GaN layer 405 is indicated by a dotted line. As such, the GaN layers formed on the first GaN layer 402 before and after ultrasound cleaning are formed by substantially the same crystal growth method and have the same structure. However, since they are grown using different processes, the GaN layers formed on the first GaN layer 402 before and after the cleaning process may be referred to as the second GaN layer 404 and the third GaN layer 405, respectively.

Figure 28:
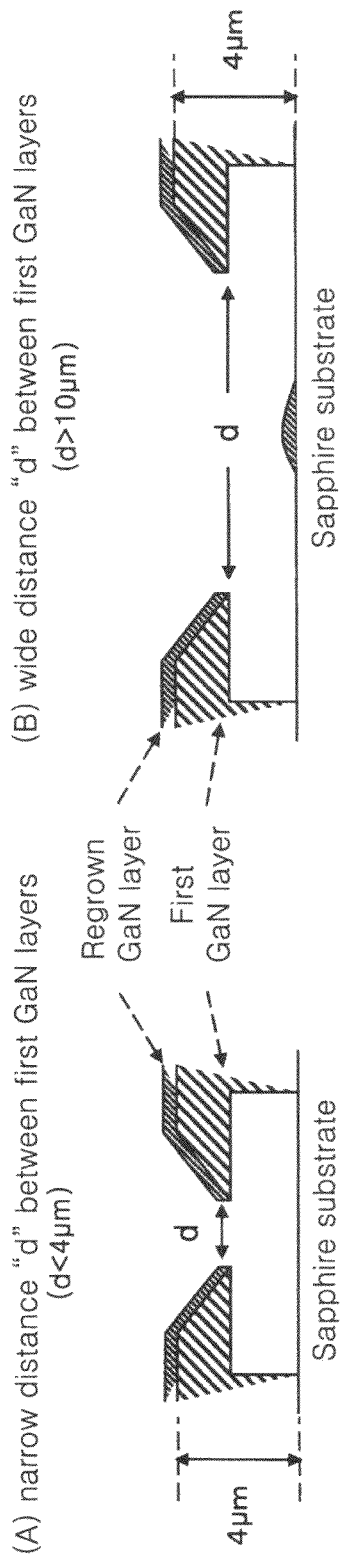
FIG. 28 is sectional views of the semiconductor substrate formed by the method in accordance with the third exemplary embodiment, showing a grown state of a GaN layer, in which (A) is a schematic sectional view of the GaN layer grown to have the first GaN layers separated by a relatively small distance from each other, and (B) is a schematic sectional view of the GaN layer grown to have the first GaN layers separated by a relatively large distance from each other.
Figure 29:
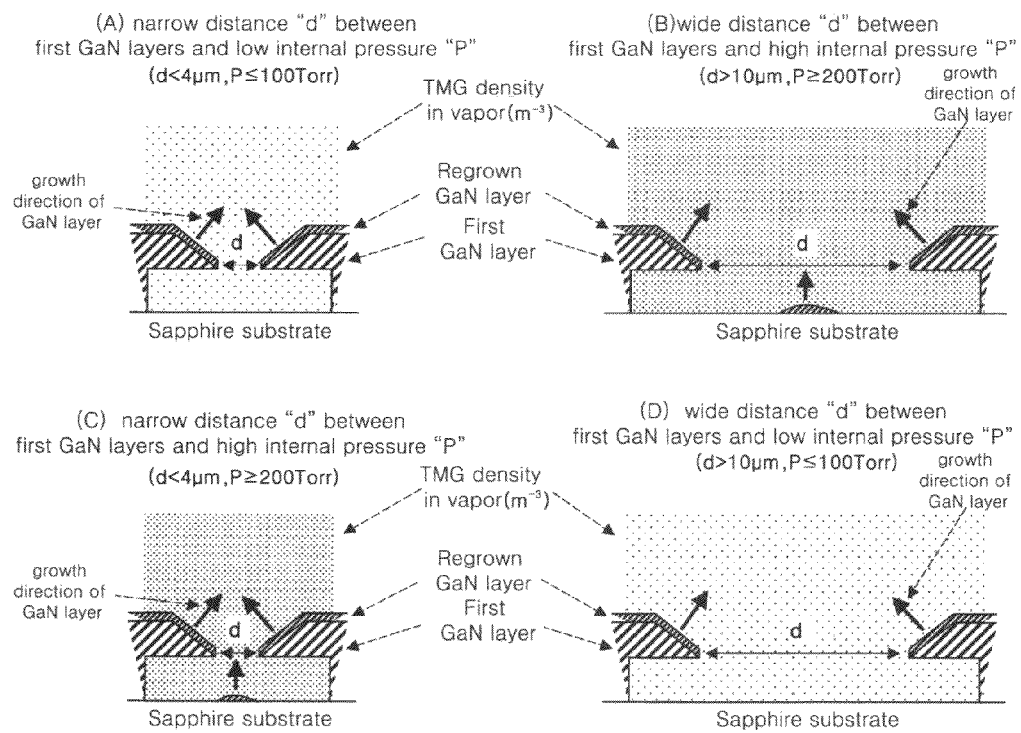
FIG. 29 is schematic sectional views of the semiconductor substrate formed by the method in accordance with the third exemplary embodiment, in which (A) shows TMG density and a grown state of the GaN layer when the first GaN layers are separated a relatively small distance from each other and an internal pressure of an MOCVD apparatus is relatively low, (B) shows TMG density and a grown state of the GaN layer when the first GaN layers are separated a relatively large distance from each other and the internal pressure of the MOCVD apparatus is relatively high, (C) shows TMG density and a grown state of the GaN layer when the first GaN layers are separated a relatively small distance from each other and the internal pressure of the MOCVD apparatus is relatively high, and (D) shows TMG density and a grown state of the GaN layer when the first GaN layers are separated a relatively large distance from each other and the internal pressure of the MOCVD apparatus is relatively low.

Further, during formation of the second GaN layer 404 (or third GaN layer 405), the width of the holes 404a formed after removal of the Ta layer 403 and the internal pressure of the MOCVD apparatus influence the formation of the cavities in the first GaN layer 402. This will be described hereinafter with reference to FIG. 28 and FIG. 29. In FIG. 28 and FIG. 29, the width of the holes 404a are indicated by a distance "d" between the first GaN layers 402. FIG. 28(A) is a schematic sectional view of the GaN layer grown to have the first GaN layers 420 separated a relatively smaller distance "d" from each other, and FIG. 28(B) is a sectional view of the GaN layer grown to have the first GaN layers 420 separated by a relatively wider distance "d" from each other. FIG. 29(A) is a sectional view showing TMG density in a vapor and a grown state of the GaN layer when the first GaN layers 402 are separated by a relatively small distance "d" from each other and the internal pressure "P" of the MOCVD apparatus is relatively low. FIG. 29(B) is a sectional view showing TMG density in a vapor and a grown state of the GaN layer when the first GaN layers 402 are separated by a relatively large distance "d" from each other and the internal pressure "P" of the MOCVD apparatus is relatively high. FIG. 29(C) is a sectional view, showing TMG density in a vapor and a grown state of the GaN layer when the first GaN layers 402 are separated by a relatively small distance "d" from each other and the internal pressure "P" of the MOCVD apparatus is relatively high. FIG. 29(D) is a sectional view showing TMG density in a vapor and a grown state of the GaN layer when the first GaN layers 402 are separated by a relatively large distance "d" from each other and the internal pressure "P" of the MOCVD apparatus is relatively low.

First, FIG. 28(A) and FIG. 28(B) will be described. In FIG. 28(A) and FIG. 28(B), when the first GaN layer 402 has a thickness of 4 μm, the distance "d" between the first GaN layers in FIG. 28(A) is less than 4 μm (d<4 μm), and the distance "d" between the first GaN layers in FIG. 28(B) is greater than 10 μm (d>10 μm). Such a distance between the first GaN layers 402 depends on the width of the Ta layer 403. For example, when the width of the Ta layer 403 is set to 4 μm in the process of forming the Ta layer 403, the distance between the first GaN layers 402 becomes less than 4 μm due to the hole 404a emptied in the first GaN layer 402 after removal of the Ta layer 403 by ultrasound cleaning, as shown in FIG. 28(A). For example, when the width of the Ta layer 403 is set to 10 μm in the process of forming the Ta layer 403, the distance between the first GaN layers 402 becomes greater than 10 μm due to the hole 404a emptied in the first GaN layer 402 after removal of the Ta layer 403 by ultrasound cleaning, as shown in FIG. 28(B).

Further, in the process of forming the second GaN layer (or third GaN layer 405) of FIG. 24A(E) (or FIG. 24B(E)), a process of growing a regrown GaN layer shown in FIG. 28(A) is different from that shown in FIG. 28(B) due to the internal pressure of the MOCVD apparatus and the distance "d" between the first GaN layers 402. In both processes of growing the regrown GaN layer shown in FIG. 28(A) and FIG. 28(B), for example, when the internal pressure of the MOCVD apparatus was set to 500 Torr, the GaN layer was not adhered to the sapphire substrate of FIG. 28(A), instead being adhered to the sapphire substrate of FIG. 28(B). On the other hand, when the internal pressure of the MOCVD apparatus was set to a pressure less than 500 Torr, for example, 10-100 Torr, the GaN layer was not adhered to the sapphire substrate in both cases of FIG. 28(A) and FIG. 28(B). Namely, when the MOCVD apparatus is set to have a lower internal pressure, the GaN layer is not adhered to the sapphire substrate even at a greater distance between the first GaN layers. When the MOCVD apparatus is set to have a higher internal pressure, the GaN layer is adhered to the sapphire substrate even at a smaller distance between the first GaN layers.

Next, a relationship between the grown state of the regrown GaN layer and the internal pressure of the MOCVD apparatus and the distance "d" between the first GaN layers will be described with reference to FIG. 29. In FIGS. 29(A) to FIG. 29(D), the term "TMG density in a vapor" means the density $(m^{-3})$ of TMG in a vapor, in which TMG is supplied for growing the regrown GaN layer. The "TMG density in a vapor" varies depending on the internal pressure of the MOCVD apparatus. When the pressure is set to a relatively low pressure, for example, 10-100 Torr, in the MOCVD apparatus, the TMG density $(m^{-3})$ in the vapor is lowered to increase a mean free process of TMG and a migration length (diffusion length) of the TMG in the GaN layer. On the other hand, when the pressure is set to a relatively high pressure, for example, 200-760 Torr, in the MOCVD apparatus, the TMG density $(m^{-3})$ in the vapor is increased to reduce the mean free process of TMG and the migration length (diffusion length) of the TMG in the GaN layer. Thus, when the growth is performed at low pressure in the MOCVD apparatus, the diffusion length increases. Herein, the term "diffusion length" refers to a movement length of the TMG as an element in the substrate and the element migrates freely until finding a chemically stabilized point where it settles. When sapphire and GaN are present in the diffusion length, GaN is the stabilized point of the TMG. The growth rate is equal in a wide substrate area, as compared to the case where the growth pressure is high. When the distance "d" between the first GaN layers is set to the same value, the amount of GaN joined to the sapphire substrate is reduced by setting the internal pressure of the MOCVD apparatus to a low value. Further, the arrows shown in FIG. 29(A) and FIG. 29(B) indicate growth directions of GaN and show that the regrown GaN layers are vertically grown with respect to surfaces (top surface and inclined surface) of the first GaN layer 402.

In FIG. 29(A), the distance "d" between the first GaN layers 402 is set to a relatively small value (d<4 μm) and the internal pressure "P" of the MOCVD apparatus is set to a relatively low value, for example, 10-100 Torr. In this case, the TMG density $(m^{-3})$ in the vapor is lowered to increase the migration length (diffusion length) of the TMG in the GaN layer, thereby retarding the growth of the GaN layer. As a result, the GaN layer is not joined to the sapphire substrate shown in FIG. 29(A). In FIG. 29(B), the distance "d" between the first GaN layers 402 is set to a relatively large value (d>10 μm) and the internal pressure "P" of the MOCVD apparatus is set to a relatively high value, for example, 200-600 Torr. In this case, the TMG density $(m^{-3})$ in the vapor is increased to shorten the migration length (diffusion length) of the TMG in the GaN layer. As a result, the GaN layer is joined to the sapphire substrate shown in FIG. 29(B).

Under the conditions of FIG. 29(A) (that is, the relatively small distance "d" between the first GaN layers and the relatively low internal pressure "P" of the MOCVD apparatus), since it may be difficult to join GaN to the sapphire substrate, the hole 404a formed after removal of the Ta layer 403 is not filled with the regrown GaN layer through growth of the regrown GaN layer, so that the cavity 402a formed in the first GaN layer 402 remains. Further, under the conditions of FIG. 29(B) (that is, the relatively large distance "d" between the first GaN layers and the relatively high internal pressure "P" of the MOCVD apparatus), since GaN may be likely to be joined to the sapphire substrate, the hole 404a formed after removal of the Ta layer 403 is filled with the regrown GaN layer through growth of the regrown GaN layer, so that the cavity 402a formed in the first GaN layer 402 does not remain.

In FIG. 29(C), the distance "d" between the first GaN layers 402 is set to a relatively small value (d<4 μm) and the internal pressure "P" of the MOCVD apparatus is set to a relatively high value, for example, 200-600 Torr. In this case, the TMG density $(m^{-3})$ in the vapor is increased to shorten the migration length (diffusion length) of the TMG in the GaN layer, thereby promoting growth of the GaN layer. As a result, the GaN layer is joined to the sapphire substrate shown in FIG. 29(B). That is, when the internal pressure of the MOCVD apparatus is set to a relatively high value, a small distance "d" between the first GaN layers 402 may make it difficult to join GaN to the sapphire substrate. In FIG. 29(D), the distance "d" between the first GaN layers 402 is set to a relatively large value (d>10 μm) and the internal pressure "P" of the MOCVD apparatus is set to a relatively low value, for example, 10-100 Torr. In this case, the TMG density $(m^{-3})$ in the vapor is lowered to increase the migration length (diffusion length) of the TMG in the GaN layer, thereby retarding growth of the GaN layer. As a result, the GaN layer is not joined to the sapphire substrate shown in FIG. 29(A).

Under the conditions of FIG. 29(C) (that is, the relatively small distance "d" between the first GaN layers and the relatively high internal pressure "P" of the MOCVD apparatus), since GaN may be easily joined to the sapphire substrate, the hole 404a formed after removal of the Ta layer 403 is filled with the regrown GaN layer through growth of the regrown GaN layer. However, since the amount of GaN joined to the sapphire substrate is less than in the case of the relatively large distance "d" between the first GaN layers, the cavity 402a formed in the first GaN layer 402 is not completely filled therewith. Further, under the conditions of FIG. 29(D) (that is, the relatively large distance "d" between the first GaN layers and the relatively low internal pressure "P" of the MOCVD apparatus), since it may be difficult to join GaN to the sapphire substrate, the hole 404a formed after removal of the Ta layer 403 is not filled with the regrown GaN layer through growth of the regrown GaN layer, so that the cavity 402a formed in the first GaN layer 402 remains.

As such, it can be ascertained that the cavity 402 may remain or may not remain in the first GaN layer 403 depending on the growth conditions of GaN, that is, the internal pressure of the MOCVD apparatus and the distance "d" between the first GaN layers 402, as shown in FIG. 29(A), FIG. 29(B), FIG. 29(C), and FIG. 29(D). Accordingly, it is possible to allow the cavity 402a to remain in the first GaN layer 402 by adjusting the growth conditions of the second GaN layer 404 (or third GaN layer 405) to set a proper distance "d" between the first GaN layers 402 and a proper internal pressure of the MOCVD apparatus.

Figure 25A:
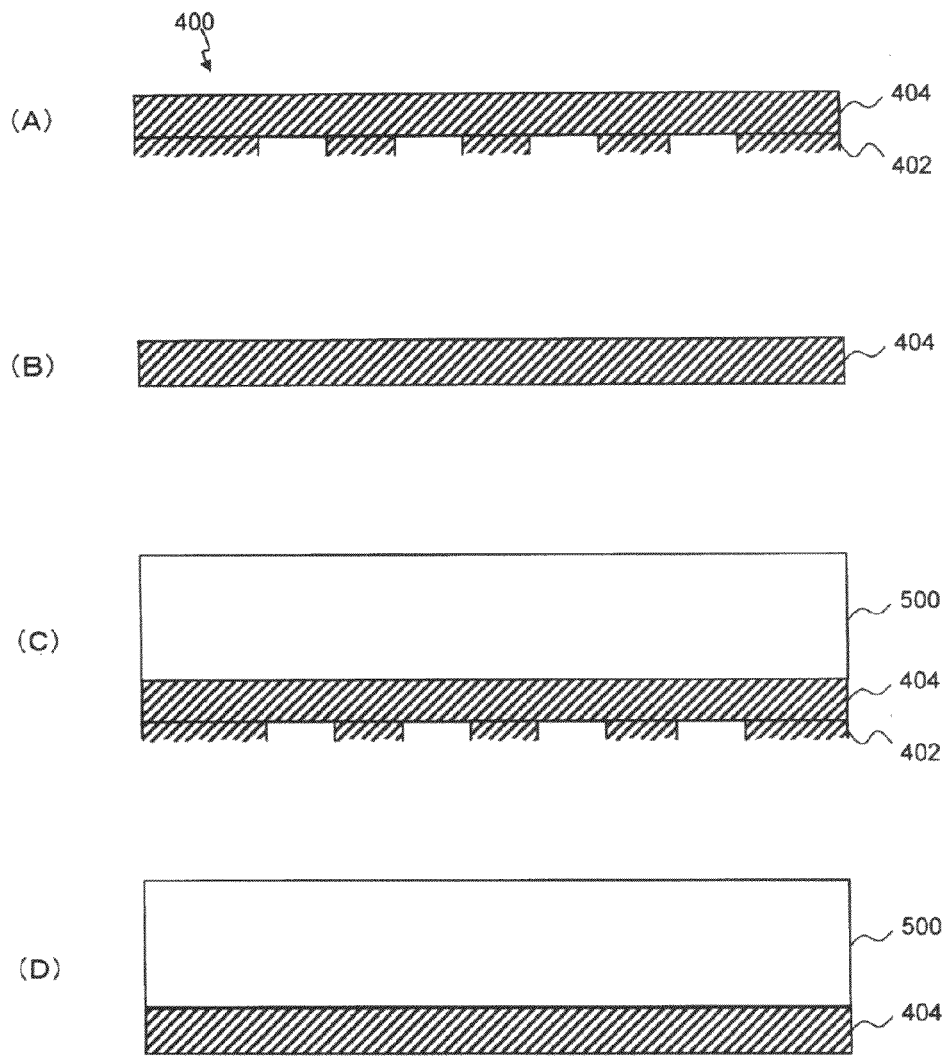
FIG. 25a is a flow diagram of the method of fabricating a semiconductor substrate, following the method of FIG. 24a, in which (A) is a sectional view of the semiconductor substrate from which a sapphire substrate has been separated, (B) is a sectional view of a finished GaN substrate, (C) and (D) are sectional views of a semiconductor substrate for devices, which is formed by attaching a silicon substrate to an upper surface of the GaN substrate and flattening a lower surface of the GaN substrate.
Figure 25B:
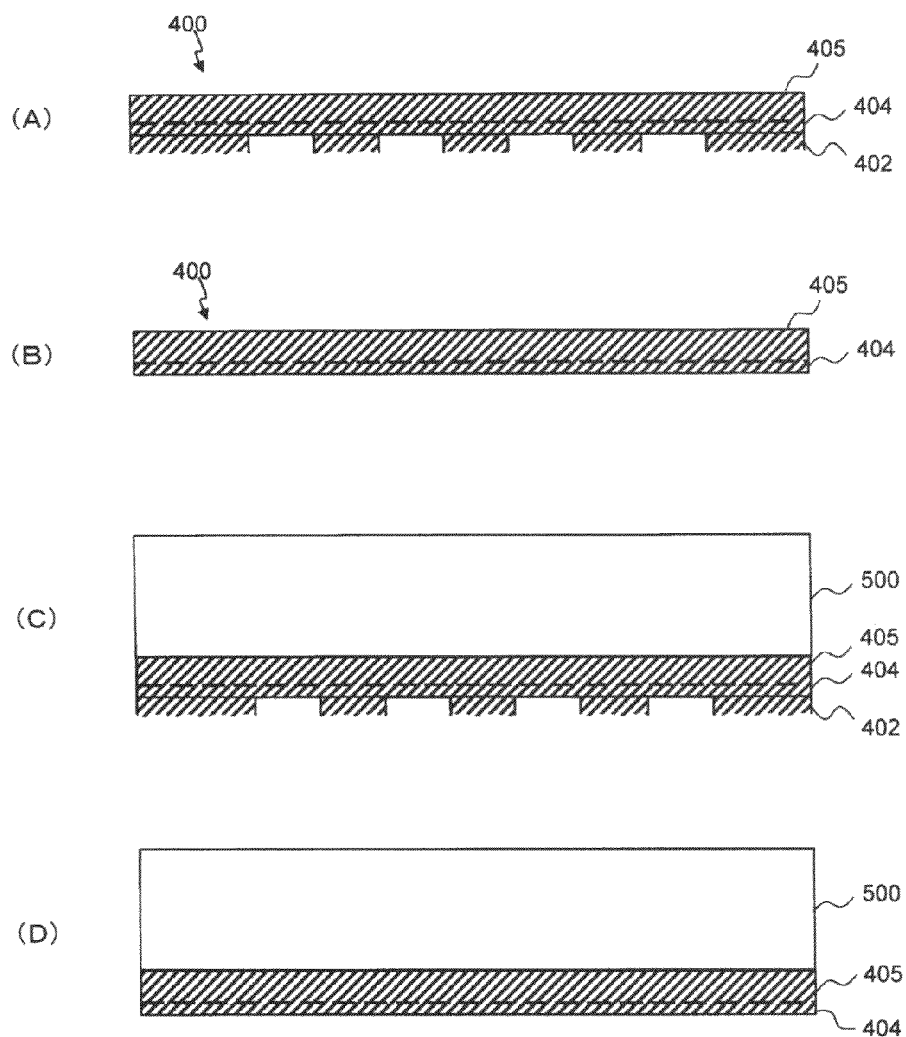
FIG. 25b is a flow diagram of the method of fabricating a semiconductor substrate, following the method of FIG. 24b, in which (A) is a sectional view of the semiconductor substrate from which a sapphire substrate has been separated, (B) is a sectional view of a finished GaN substrate, (C) and (D) are sectional views of a semiconductor substrate for devices, which is formed by attaching a silicon substrate to an upper surface of the GaN substrate and flattening a lower surface of the GaN substrate.

Next, referring to FIG. 25a(A), the sapphire substrate 401 is separated. Then, referring to FIG. 25a(B), the GaN substrate 400 may be obtained by polishing the first GaN layer 402, from which the sapphire substrate has been removed. Further, as shown in FIG. 25a(C) and FIG. 25a(D), the GaN substrate 400 may be used as a semiconductor substrate for a device by attaching a silicon-based substrate 500 such as a Si or SiC substrate to an upper side of the GaN substrate 400 and flattening a lower surface thereof. Separation of the sapphire substrate 401 may be performed using the cavity 402a formed in the first GaN layer 102. Further, separation of the sapphire substrate 401 may be performed by, for example, a laser lift-off or polishing process. This results in separation into two substrates, which include the sapphire substrate 401 and an Si or SiC substrate 500 attached to an epitaxial growth side (i.e., the second GaN layer 404). It should be understood that the method of separating the sapphire substrate 401 is not limited to a specific one in the third exemplary embodiment. Further, in FIG. 25b, (A) shows a process of separating the sapphire substrate 401 from the semiconductor substrate 400 shown in FIG. 24b(E), and (B) shows a process of polishing the first GaN layer 402, from which the sapphire substrate has been separated. In FIG. 25b(A) and FIG. 25b(B), the border between the second GaN layer 404 and the third GaN layer 405 is indicated by a dotted line. Further, as shown in FIG. 25b(C) and FIG. 25b(D), the GaN substrate 400 may be used as a semiconductor substrate for a device by attaching a silicon-based substrate 500 such as a Si or SiC substrate to an upper side of the GaN substrate 400 and flattening a lower surface thereof.

As such, in the semiconductor substrate 400 according to the third exemplary embodiment, when forming the second GaN layer 404 (or third GaN layer 405), a portion of the second GaN layer 404 (or the second GaN layer 404) is first formed by annealing the semiconductor substrate 400 while holding the internal pressure of the MOCVD apparatus constant by supplying NH₃ gas to the MOCVD apparatus. Then, the semiconductor substrate 400 is removed from the MOCVD apparatus to remove the Ta layer 403 by ultrasound cleaning and is then returned back to the MOCVD apparatus. Then, while adjusting the internal pressure of the MOCVD apparatus by supplying TMG to the semiconductor substrate therein, an additional second GaN layer 404 (or third GaN layer 405) is formed, thereby allowing the cavities 402a to be formed in the first GaN layer 402 through holes, which are formed by removal of the Ta layer 403. Thus, when forming the second GaN layer 404 (or third GaN layer 405) in the third exemplary embodiment, it is possible to form the cavities 402a in the first GaN layer 402 using the holes formed after the Ta layer is removed by ultrasound cleaning. In other words, the cavities 402a may be formed in the first GaN layer 402 by forming the metallic material layer which permits formation of the holes at portions on the first GaN layer 402 as described above. Further, in the semiconductor substrate 400 of the third exemplary embodiment, since the Ta layer 403 is removed by the ultrasound cleaning before the second GaN layer 404 is formed, it is possible to form the second GaN layer 404 having a flat surface without precipitation of granular materials on the surface thereof.

The MOCVD conditions of the third exemplary embodiment are provided as an example, and thus, may be set to allow the second GaN layer 404 (or third GaN layer 405) and the cavity 402a to be simultaneously formed. Since the formation of the cavity 402a in the first GaN layer 402 depends on the width of the Ta layer 403 and the internal pressure of the MOCVD apparatus during the growth of the second GaN layer 404 (or third GaN layer 405), the width of the Ta layer 403 and the internal pressure of the MOCVD apparatus are adjusted in the third exemplary embodiment.

Further, in the third exemplary embodiment, the shape of the Ta layer 403 is not limited to the aforementioned stripe shape, and may be changed depending on a device structure to be formed on the semiconductor substrate 400. An example of a device formed using the semiconductor substrate 400 will be described below.

Further, the semiconductor substrate 400 of the third exemplary embodiment may be reused as a substrate 401 for forming a GaN layer having the aforementioned cavity. In this case, the GaN substrate may be separated and then a surface of the sapphire substrate 401 on which a new GaN substrate is formed may be flattened by RIE or the like. Hence, manufacturing costs of the GaN substrate may be further reduced.

In the third exemplary embodiment as shown in FIG. 27, pure water was used for ultrasound cleaning to remove the Ta layer from the semiconductor substrate. In testing of other solutions which do not dissolve the first GaN layer and the second GaN layer, NaOH, KOH, and HF were used to remove the Ta layer from the semiconductor substrate.

First Experimental Example

Figure 30:
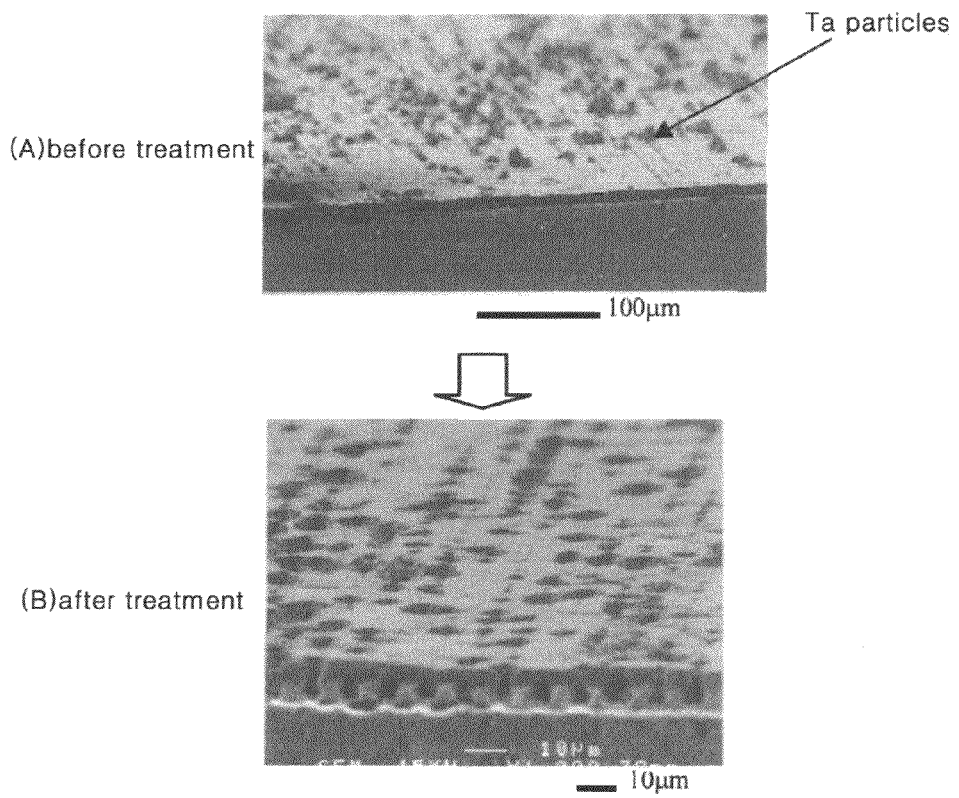
FIG. 30 is SEM micrographs of a surface of the semiconductor substrate according to a second example of the third exemplary embodiment shown in a perspective view before and after etching with KOH.

In the first experimental example, an experiment of removing a Ta layer was performed using KOH. After a Ni crucible containing KOH was placed in an MOCVD apparatus (not shown) and heated to 300° C., a semiconductor substrate 400 having a Ta layer 403 formed on a first GaN layer 402 shown in FIG. 24a(B) was then placed in the MOCVD apparatus, held for 3 minutes, and subjected to etching. FIG. 30 is SEM micrographs of a surface of the semiconductor substrate 400 in a perspective view before and after etching. In FIG. 30, (A) is a SEM micrograph of the surface of the semiconductor substrate 400 in a perspective view before etching and (B) is a SEM micrograph of the surface of the semiconductor substrate 400 in a perspective view after etching. In FIG. 30(A), Ta particles remained on the surface of the semiconductor substrate 400 before etching. In FIG. 30(B), the Ta particles shown in FIG. 30(A) were removed from the surface of the semiconductor substrate by etching to make the surface of the semiconductor substrate irregular. Accordingly, it could be ascertained that the Ta particles were removed from the surface of the semiconductor substrate 400 by etching with KOH.

Second Experimental Example

Figure 31:
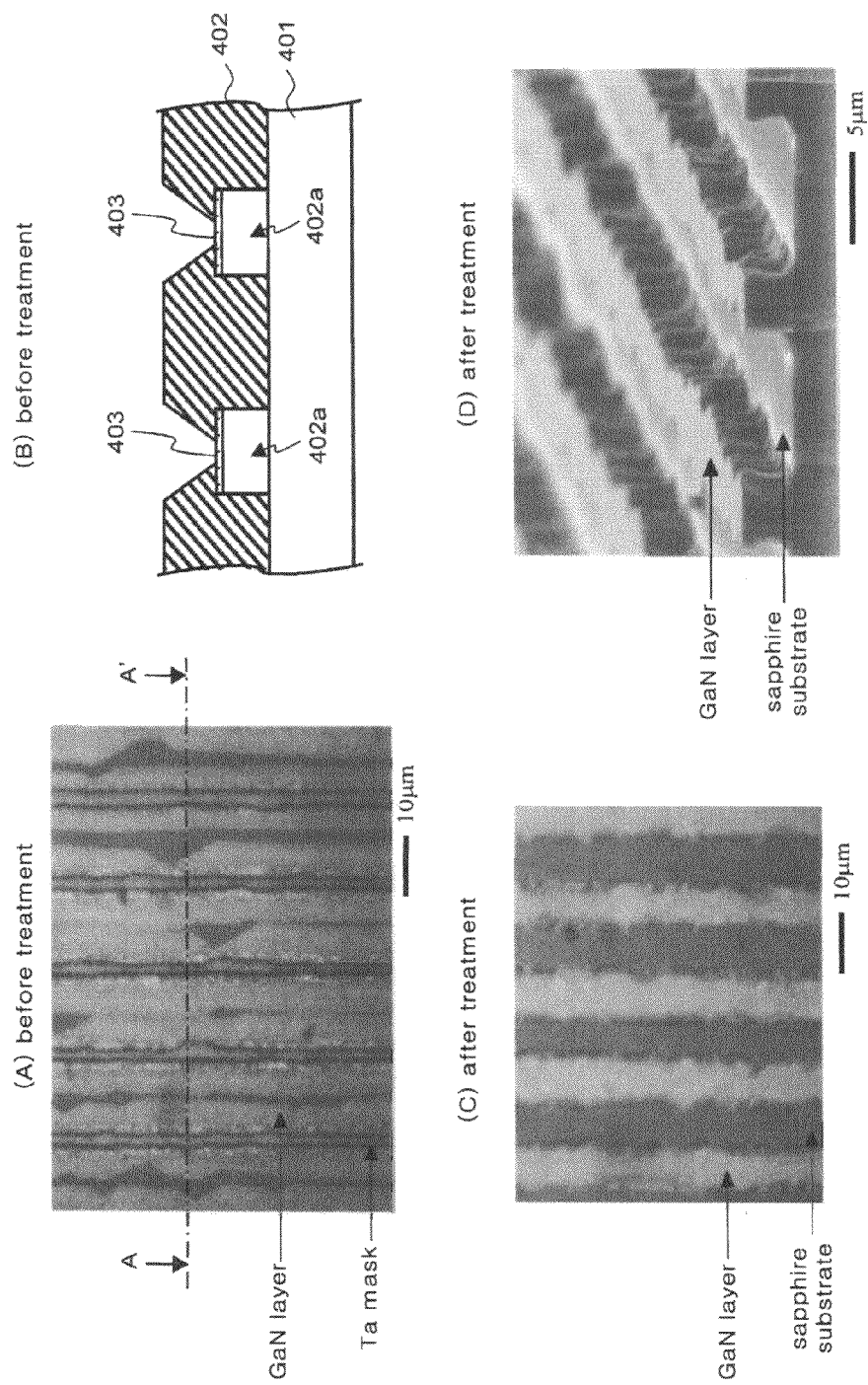
FIG. 31 is an optical micrograph of a surface of the semiconductor substrate according to a third example of the third exemplary embodiment before and after etching with KOH, a sectional view of the semiconductor substrate, and a SEM micrograph of the semiconductor substrate shown in a perspective view.

In the second experimental example, an experiment of removing a Ta mask was performed using KOH. After a Ni crucible containing KOH was placed in an MOCVD apparatus (not shown) and heated to 200° C., a semiconductor substrate 400 having a Ta layer 403 formed on a first GaN layer 402 shown in FIG. 24a(B) was then placed in the MOCVD apparatus, held for 5 minutes, and subjected to etching. FIG. 31 is SEM micrographs of a surface of the semiconductor substrate 400 before and after etching. In FIG. 31, (A) is an optical micrograph of the surface of the semiconductor substrate 400 before etching, (B) is a side section view taken along line A-A' of (A), (C) is a SEM micrograph of the surface of the semiconductor substrate 400 after etching, and (D) is a SEM micrograph of the surface of the semiconductor substrate 400 in a perspective view after etching. In FIG. 31(A) and FIG. 31(B), a cavity 402a is formed in a portion of a first GaN layer 402 under a Ta mask 403. In FIG. 31(C) and FIG. 31(D), a portion of the first GaN layer 402 and the Ta mask 403 shown in FIG. 31(A) were removed by etching, so that the surface of the semiconductor substrate became irregular due to the remaining first GaN layer 402 and the cavity 402a. Further, the sapphire substrate 401 is exposed at a portion of the bottom corresponding to the cavity 402a. Accordingly, it could be ascertained that the Ta mask 403 was removed from the surface of the semiconductor substrate by etching with KOH. In this case, it could be ascertained that when the distance between the Ta masks 403 is 2 μm or less, the cavity 402 were formed and that the surface of the semiconductor substrate became irregular by the removal of the Ta masks 403.

Third Experimental Example

Figure 32:
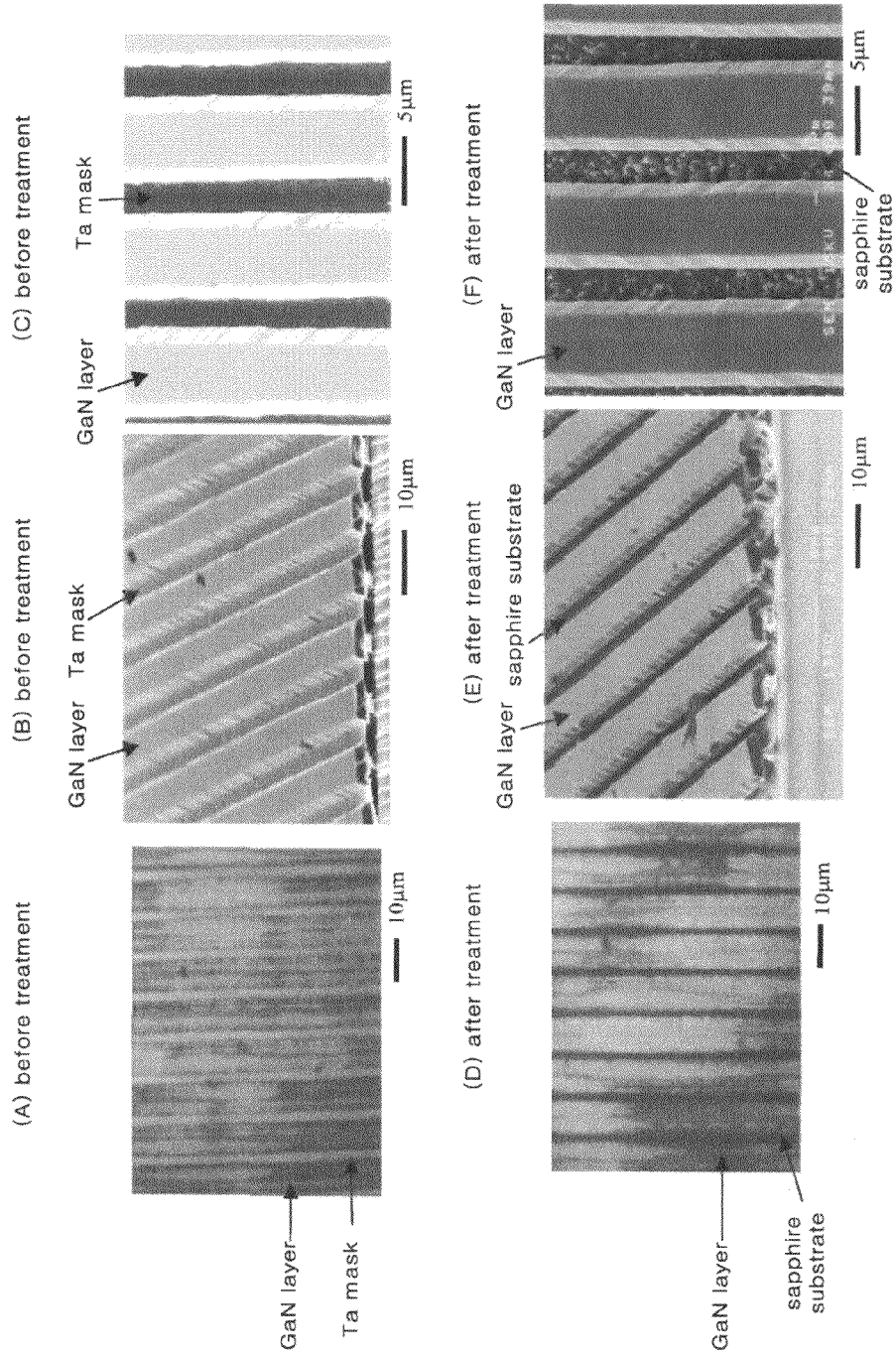
FIG. 32 is a SEM micrograph and an optical micrograph of a surface of the semiconductor substrate according to a fourth example of the third exemplary embodiment shown in a perspective view before and after dipping with a HF aqueous solution.

In the third experimental example, an experiment of removing a Ta mask was performed using HF. A semiconductor substrate 400 having a Ta layer 403 formed on a first GaN layer 402 shown in FIG. 24a(B) was dipped in a 50% HF solution, held for 24 hours, and cleaned with water. FIG. 32 is SEM micrographs of a surface of the semiconductor substrate 400 before and after cleaning. In FIG. 32, (A) is an optical micrograph of the surface of the semiconductor substrate 400 before cleaning, (B) is a SEM micrograph of the surface of the semiconductor substrate 400 in a perspective view before cleaning, (C) is a SEM micrograph of the surface of the semiconductor substrate 400 before cleaning, (D) is an optical micrograph of the surface of the semiconductor substrate 400 after cleaning, (E) is a SEM micrograph of the surface of the semiconductor substrate 400 in a perspective view after cleaning, and (F) is a SEM micrograph of the surface of the semiconductor substrate 400 after cleaning. In FIG. 32(B), a cavity 402a is formed in a portion of a first GaN layer 402 under a Ta mask 403. In FIG. 32(D), FIG. 32(E), and FIG.

32(F), a portion of the first GaN layer 402 and the Ta mask 403 shown in FIG. 32(A), FIG. 32(B) and FIG. 32(C) were removed by cleaning, so that the surface of the semiconductor substrate became irregular due to the remaining first GaN layer 402 and the cavity 402a. Further, the sapphire substrate 401 is exposed at a portion of the bottom corresponding to the cavity 402a. Accordingly, it could be ascertained that the Ta mask 403 was removed from the surface of the semiconductor substrate by etching with HF.

Figure 33:
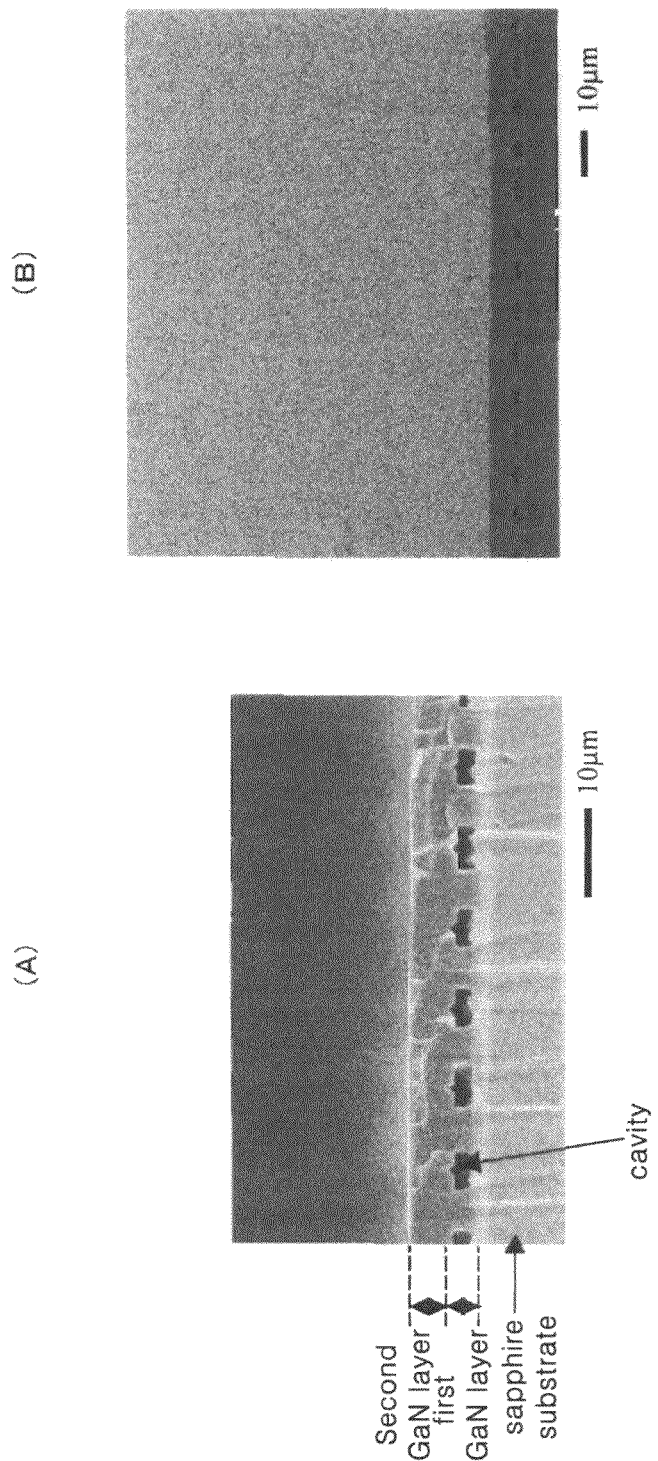
FIG. 33 is a SEM micrograph of a surface of the semiconductor substrate according to the fourth example of the third exemplary embodiment after forming the second GaN layer.

After removing the Ta mask 403 using the HF solution, a second GaN layer 404 was grown. In this case, growth of the second GaN layer 404 was performed by heating at 1010° C. for 90 minutes while supplying TMG as a raw gas at a flux of 80 μmol/min and $NH_3$ gas at 5 SLM. FIG. 33 shows the second GaN layer 404. In FIG. 33, (A) is a SEM micrograph of a surface of the semiconductor substrate 400 and (B) is a SEM micrograph of the surface of the semiconductor substrate 400 in a perspective view. As shown in FIG. 33(A) and FIG. 33(B), it could be ascertained that the cavity was formed in a depressed portion, which was formed by removing the Ta mask 403, after forming the second GaN layer 404.

Fourth Experimental Example

Figure 34:
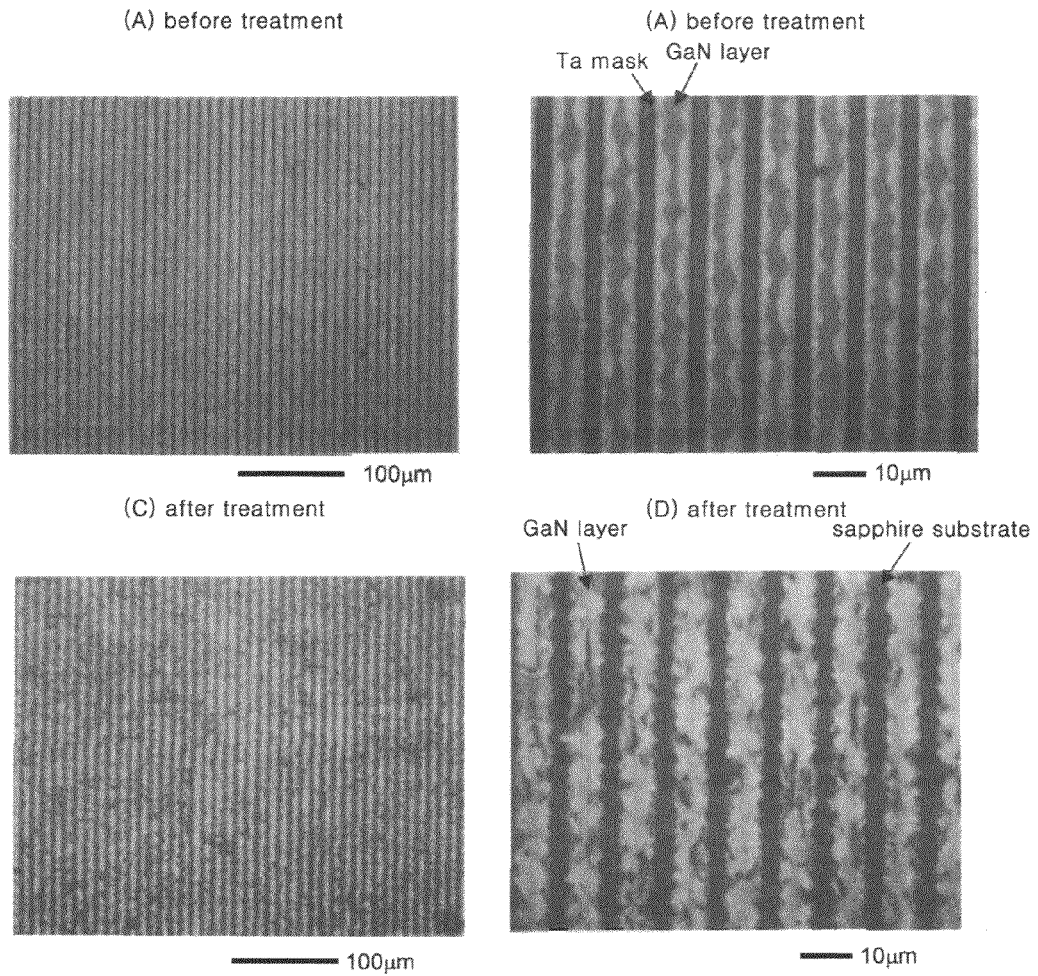
FIG. 34 is optical micrographs of a surface of the semiconductor substrate according to a fifth example of the third exemplary embodiment shown in a perspective view before and after etching with NaOH.

In the fourth experimental example, an experiment of removing a Ta mask was performed using NaOH. After a Ni crucible containing NaOH was heated to 300° C. in an MOCVD apparatus (not shown), a semiconductor substrate 400 having a Ta layer 403 formed on a first GaN layer 402 shown in FIG. 24a(B) was etched for 10 minutes. After etching, the semiconductor substrate 400 was cleaned with water. FIG. 34 is SEM micrographs of a surface of the semiconductor substrate 400 before and after etching. In FIG. 34, (A) is an optical micrograph of the surface of the semiconductor substrate 400 before etching, (B) is an enlarged optical micrograph of (A), (C) is an optical micrograph of the surface of the semiconductor substrate 400 after etching, and (D) is an enlarged optical micrograph of (C). In FIG. 35(C), a portion of the first GaN layer 402 and the Ta mask 403 shown in FIG. 34(A) and FIG. 34(B) were removed by etching, so that the surface of the semiconductor substrate became irregular due to the remaining first GaN layer 402 and the cavity 402a. Accordingly, it could be ascertained that the Ta mask 403 was removed from the surface of the semiconductor substrate by etching with NaOH.

Figure 35:
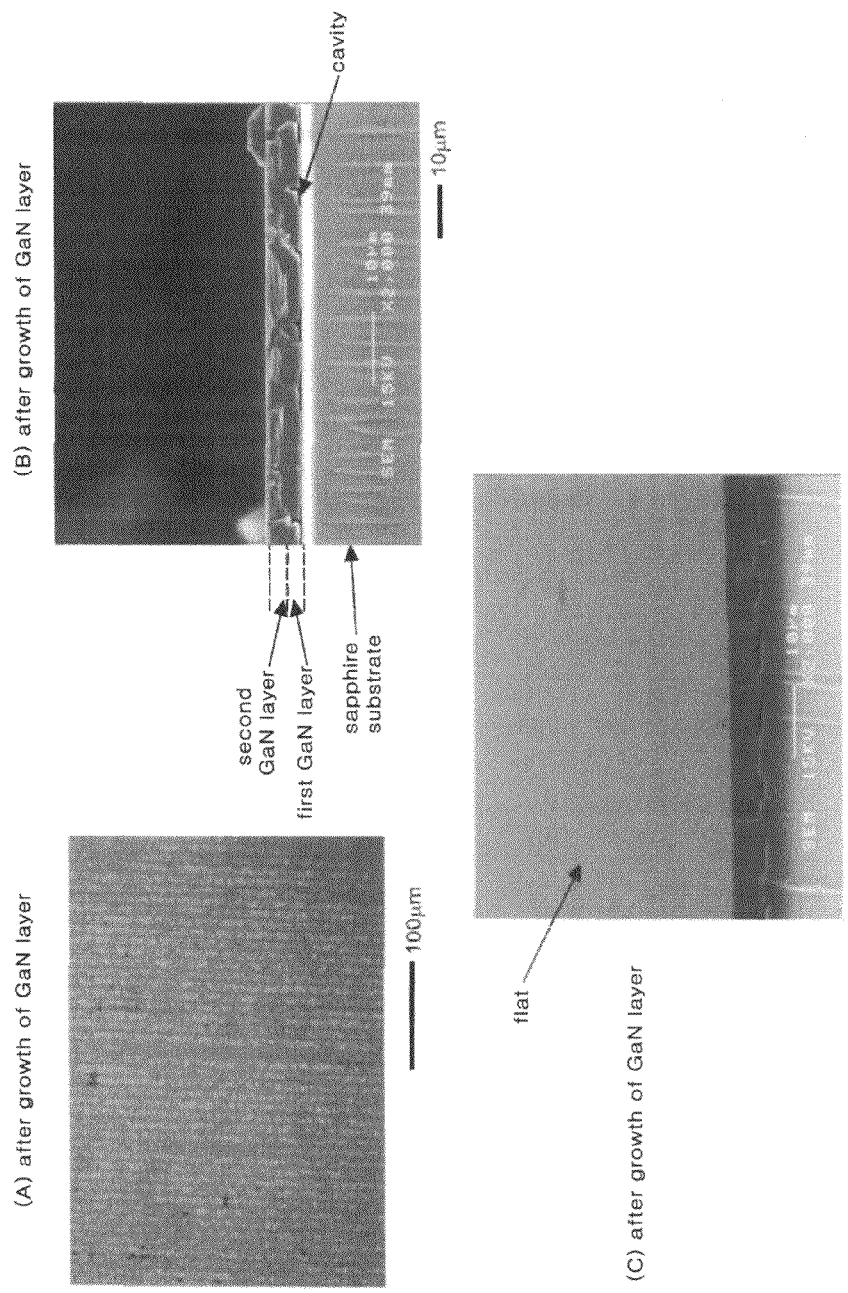
FIG. 35 is SEM and optical micrographs of a surface of the semiconductor substrate according to the fifth example of the third exemplary embodiment after forming the second GaN layer, a SEM micrograph of a side section of the semiconductor substrate, and a SEM micrograph of the semiconductor substrate shown in a perspective view.

After removing the Ta mask 403 using the NaOH solution, a second GaN layer 404 was grown. In this case, growth of the second GaN layer 404 was performed by heating at 1010° C. for 90 minutes while supplying TMG as a raw gas at a flux of 40 μmol/min and $NH_3$ gas at 5 SLM. FIG. 33 shows the second GaN layer 404. In FIG. 35, (A) is a SEM micrograph of a surface of the semiconductor substrate 400, (B) is a SEM micrograph of a side section of the semiconductor substrate 400 of (A), and (C) is a SEM micrograph of the surface of the semiconductor substrate 400 in a perspective view. As shown in FIG. 35(B), it could be ascertained that a small cavity was formed in a depressed portion, which was formed by removing the Ta mask 403, after forming the second GaN layer 404. Further, the surface of the second GaN layer 404 became flattened as shown in FIG. 35(C).

As such, it could be ascertained that the Ta particles were removed from the surface of the semiconductor substrate 400 by etching with KOH in the first example. Further, it could be ascertained that the Ta mask was removed from the surface of the semiconductor substrate 400 by etching with KOH in the second example, by dipping in the HF solution in the third example, or by etching with NaOH in the fourth example, and that the cavity was formed in the depressed portion formed due to removal of the Ta mask after formation of the second GaN layer.

Fourth Exemplary Embodiment

As an example of a semiconductor device, a light emitting diode (LED) array formed on the semiconductor substrate 100 of the first exemplary embodiment, the semiconductor substrate 300 of the second exemplary embodiment or the semiconductor substrate 400 of the third exemplary embodiment will be described with reference to FIG. 11.

Figure 11:
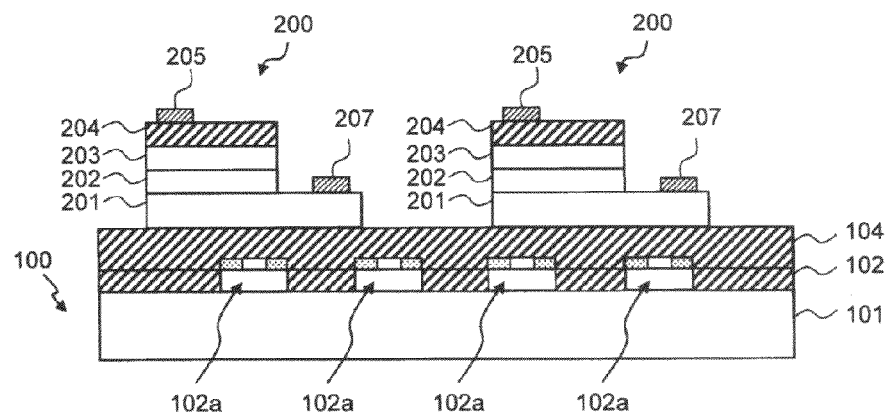
FIG. 11 is a sectional view of an LED array according to a third exemplary embodiment of the present invention.

FIG. 11 is a sectional view of an LED array in accordance with the fourth exemplary embodiment. In FIG. 11, the semiconductor substrate 100 is used as an example.

Referring to FIG. 11, a plurality of LEDs 200 is separated from each other on the semiconductor substrate 100. Each of the LEDs 200 includes a lower semiconductor layer 201 composed of a first conductive type compound semiconductor layer, an active layer 202, and an upper semiconductor layer 203 composed of a second conductive type compound semiconductor layer. The active layer 202 may have a single or multi-quantum well structure having a barrier layer and may be formed of a material and composition selected depending on desired emission spectrum. For example, the active layer 202 may be formed of a GaN-based compound semiconductor. The upper semiconductor layer 203 and the lower semiconductor layer 201 may be a GaN-based compound semiconductor having a greater band gap than that of the active layer 202.

In the present exemplary embodiment, the lower semiconductor layer 201 on the semiconductor substrate 100 is formed on the second GaN layer 104. Thus, it is possible to reduce manufacturing costs by manufacturing the LEDs 200 using the semiconductor substrate 100.

The upper semiconductor layer 203 is located above a portion of the lower semiconductor layer 201, and the active layer 202 is interposed between the upper semiconductor layer 203 and the lower semiconductor layer 201. Further, an upper electrode layer 204 may be formed on the upper semiconductor layer 203. The upper electrode layer 204 may be a transparent electrode layer formed of, for example, indium tin oxide (ITO), Ni/Au, or the like.

Further, an upper electrode pad 205 is formed on the upper electrode layer 204 and a lower electrode 207 is formed on an exposed region of the lower semiconductor layer 201.

As such, after the LEDs 200 are formed on the single semiconductor substrate 100, the LEDs 200 are divided into individual LEDs 200 by cutting a portion of the semiconductor substrate 100 between the LEDs 200. In the LED of this exemplary embodiment, the upper electrode 205 and the lower electrode pad 207 are laterally arranged, but an LED may be manufactured to have vertically arranged electrodes. Specifically, a vertical LED may be manufactured by separating the sapphire substrate 101 using the cavity 102a of the semiconductor substrate 100, flattening the separated surface of the first GaN layer 102 by RIE or the like, and forming a lower electrode pad.

As such, it is possible to reduce manufacturing costs of the LEDs by manufacturing a plurality of LEDs 200 using the semiconductor substrate 100 or 300. Further, when forming the LEDs 200 on the second GaN layer 104, it is possible to construct an LED array with improved light emitting efficiency and high brightness by forming the compound semiconductors such that the second GaN layer 104 and the lower semiconductor layer 201 have different indices of refraction. Further, when a laser diode is formed using the GaN substrate 100 or 300, from which the sapphire substrate 101 has been separated, it is possible to achieve improved heat dissipation together with long lifetime of the laser diode, since the laser diode is formed on the GaN layer 104, which exhibits better thermal conductivity than the sapphire substrate 101.

In the fourth exemplary embodiment, the LEDs 200 are illustrated as being formed on the second GaN layer of the semiconductor substrate 100 or 300. In an alternative embodiment, the LEDs 200 may be formed in the same manner using the GaN substrate which is separated from the sapphire substrate 101. In addition, a semiconductor device, such as an FET and the like, may be formed by attaching a silicon-based substrate, such as Si or SiC, as an indication material, to a surface of the GaN substrate, which is separated from the sapphire substrate 101, and polishing the separated surface of the GaN substrate by RIE or the like. In this case, a high-current device can be manufactured.

As such, since the semiconductor devices such as LEDs or laser diodes are formed on the semiconductor substrate 100 or 300, the semiconductor devices may be easily manufactured at low cost without using an expensive GaN substrate.

Furthermore, in the first to third exemplary embodiments described above, the Ta layer, the Ti layer, or the Cr layer is formed as the metallic material layer. In an alternative embodiment, an alloy of plural metals, an alloy of metal and semiconductor, or the like may also be used as the metallic material layer, so long as the alloy allows the formation of the cavity in the first GaN layer by etching.

As such, according to the exemplary embodiments of the present invention, the method may enable fabrication of a flat and easily separable GaN substrate on a heterogeneous substrate at low cost.

Further, according to the exemplary embodiments of the present invention, the semiconductor device such as LEDs or laser diodes manufactured using the GaN substrate may have improved performance or long operational lifespan.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a light emitting device using a recycled substrate, the method comprising:
    forming a plurality of compound semiconductor layers on a first substrate, the compound semiconductor layers comprising a first semiconductor layer;
    forming a patterned layer on the first semiconductor layer, the patterned layer comprising a metallic layer;
    forming a second semiconductor layer on the first semiconductor layer, wherein a plurality of cavities are formed in the first semiconductor layer while forming the second semiconductor layer;
    depositing a second substrate on the plurality of compound semiconductor layers, after forming the plurality of compound semiconductor layers on the first substrate;
    separating the first substrate from the plurality of compound semiconductor layers at the first semiconductor layer, thereby exposing a first surface of the first semiconductor layer; and
    removing the first semiconductor layer,
    wherein separating the first substrate from the plurality of compound semiconductor layers comprises:
        etching both the first semiconductor layer, to increase the volume of each of the plurality of the cavities, and at least a part of the patterned layer, using a chemical solution, before removing the first semiconductor layer.

2. The method of claim 1, wherein etching comprises etching a part of the first semiconductor layer using a chemical solution.

3. The method of claim 1, wherein the chemical solution comprises at least one of HF, NaOH, and KOH.

4. The method of claim 1, wherein the first substrate comprises GaN.

5. The method of claim 1, wherein the plurality of compound semiconductor layers comprises Ga and N.

6. The method of claim 1, wherein the first semiconductor layer comprises a different material from the second semiconductor layer.

7. The method of claim 1, wherein the second semiconductor layer is formed at over 1000 degrees Celsius.

8. The method of claim 1, wherein a distance between a center of a cavity of the plurality of cavities and the first substrate is less than a distance between the edge of the cavity and the first substrate.

9. The method of claim 1, wherein the second substrate is disposed on a second side of the plurality of compound semiconductor layers opposite to the first substrate.

10. The method of claim 1, wherein the first substrate is a recycled substrate, the plurality of compound semiconductor layers being formed on the recycled first substrate.

* * * * *